(12) United States Patent
Shim

(10) Patent No.: US 12,328,961 B2
(45) Date of Patent: *Jun. 10, 2025

(54) IMAGE SENSOR INCLUDING SHARED PIXELS

(71) Applicant: Samsung Electronics Co., Ltd., Suwon-si (KR)

(72) Inventor: Eunsub Shim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 553 days.

This patent is subject to a terminal disclaimer.

(21) Appl. No.: 17/687,805

(22) Filed: Mar. 7, 2022

(65) Prior Publication Data

US 2022/0190005 A1  Jun. 16, 2022

Related U.S. Application Data

(63) Continuation of application No. 16/804,674, filed on Feb. 28, 2020, now Pat. No. 11,282,875.

(30) Foreign Application Priority Data

Apr. 10, 2019 (KR) ........................ 10-2019-0042184

(51) Int. Cl.
  *H01L 27/146* (2006.01)
  *H10F 39/00* (2025.01)

(52) U.S. Cl.
  CPC ..... *H10F 39/8033* (2025.01); *H10F 39/8053* (2025.01); *H10F 39/8063* (2025.01); *H10F 39/807* (2025.01)

(58) Field of Classification Search
  CPC ........................... H10F 39/8033; H10F 39/807
  See application file for complete search history.

(56) References Cited

U.S. PATENT DOCUMENTS 6,937,270 B1   8/2005   Dong et al.
7,381,936 B2   6/2008   Tan et al.
(Continued)

FOREIGN PATENT DOCUMENTS

JP   2006-173634 A   6/2006
KR   10-2018-0051145 A   5/2018

OTHER PUBLICATIONS

Notice of Allowance dated Nov. 17, 2021, issued in corresponding U.S. Appl. No. 16/804,674.
(Continued)

*Primary Examiner* — Ali Naraghi
(74) *Attorney, Agent, or Firm* — HARNESS, DICKEY & PIERCE, P.L.C.

(57) ABSTRACT

An image sensor may include a first shared pixel region and a first isolation layer on a substrate, the first isolation layer defining the first shared pixel region. The first shared pixel region may include photo-sensing devices in sub-pixel regions and a first floating diffusion region connected to the photo-sensing devices. The sub-pixel regions may include a first sub-pixel region and a second sub-pixel region that constitute a first pixel group region. The sub-pixel regions may include a third sub-pixel region and a fourth sub-pixel region that constitute a second pixel group region. The first shared pixel region may include first and second well regions doped with first conductivity type impurities. The second well region may be spaced apart from the first well region. The first pixel group region may share a first well region. The second pixel group region may share the second well region.

11 Claims, 15 Drawing Sheets

(56) References Cited

U.S. PATENT DOCUMENTS

| | | | |
|---|---|---|---|
| 7,646,403 B2 | 1/2010 | Silverbrook et al. | |
| 7,916,362 B2 | 3/2011 | Kijima et al. | |
| 8,716,769 B2 | 5/2014 | Ihara et al. | |
| 9,398,205 B2 | 7/2016 | Cote et al. | |
| 9,578,223 B2 | 2/2017 | Luo et al. | |
| 10,177,182 B2* | 1/2019 | Kim | H10F 39/802 |
| 10,424,609 B2 | 9/2019 | Lee et al. | |
| 10,998,365 B2* | 5/2021 | Pyo | H10F 39/8027 |
| 11,282,875 B2* | 3/2022 | Shim | H01L 27/14609 |
| 2010/0006969 A1* | 1/2010 | Park | H10F 39/8053 |
| | | | 257/446 |
| 2010/0225252 A1 | 9/2010 | Weaver et al. | |
| 2010/0230583 A1 | 9/2010 | Nakata et al. | |
| 2013/0049082 A1 | 2/2013 | Kato et al. | |
| 2014/0054662 A1* | 2/2014 | Yanagita | H10F 39/8063 |
| | | | 438/73 |
| 2015/0319420 A1* | 11/2015 | Fettig | H04N 13/20 |
| | | | 348/49 |
| 2017/0047363 A1* | 2/2017 | Choi | H01L 27/1464 |
| 2017/0053962 A1 | 2/2017 | Oh et al. | |
| 2017/0104020 A1* | 4/2017 | Lee | H10F 39/807 |
| 2018/0286897 A1 | 10/2018 | Watanabe et al. | |
| 2019/0131333 A1 | 5/2019 | Borthakur et al. | |
| 2019/0172868 A1* | 6/2019 | Chen | G02B 27/0172 |
| 2020/0075660 A1* | 3/2020 | Koyama | H01L 27/14603 |
| 2020/0127037 A1* | 4/2020 | Kato | H10F 39/807 |

OTHER PUBLICATIONS

Notice of Allowance for Korean Application No. 10-2019-0042184 dated Aug. 31, 2023.

* cited by examiner

IMAGE SENSOR INCLUDING SHARED PIXELS

CROSS-REFERENCE TO RELATED APPLICATION

This application is a continuation of U.S. patent application Ser. No. 16/804,674, filed Feb. 28, 2020, which claims the benefit of Korean Patent Application No. 10-2019-0042184, filed on Apr. 10, 2019, in the Korean Intellectual Property Office, the disclosure of each of which is incorporated herein in its entirety by reference.

BACKGROUND

Inventive concepts relates to image sensors, and more particularly, to an image sensor including shared pixels including photodiodes.

Image sensors that capture an image and convert the image into an electrical signal are used not only in general consumer electronic devices such as digital cameras, mobile phone cameras, or portable camcorders, but also in cameras that are mounted on vehicles, security systems, or robots.

The sizes of pixels in image sensors continuously decrease to increase resolution, and the reduction in pixel sizes impedes formation of uniform patterns of isolation layers and doped well patterns in the pixels. In spite of the reduction in the pixel sizes, an image needs to have sufficient quality.

SUMMARY

Inventive concepts provide an image sensor by which a full well capacity (FWC) may be increased and patterns of isolation layers and doped well patterns in pixels may be uniformly formed.

According to an aspect of inventive concepts, there is provided an image sensor. The image sensor may include a substrate including a first shared pixel region and a first isolation layer on the substrate. The first isolation layer may define the first shared pixel region. The first shared pixel region may include a plurality of photo-sensing devices in a plurality of sub-pixel regions. The first shared pixel region may include a first floating diffusion region connected to the plurality of photo-sensing devices included in the first shared pixel region. The plurality of sub-pixel regions in the first shared pixel region may include a first sub-pixel region and a second sub-pixel region that may be arranged side by side in a first direction and may constitute a first pixel group region. The plurality of sub-pixel regions in the first shared pixel region may include a third sub-pixel region and a fourth sub-pixel region that may be arranged side by side in the first direction and may constitute a second pixel group region. The first shared pixel region may include a first well region doped with first conductivity type impurities and a second well region doped with the first conductivity type impurities. The second well region may be spaced apart from the first well region. The first pixel group region may share the first well region. The second pixel group region may share the second well region.

According to another aspect of inventive concepts, there is provided an image sensor. The image sensor may include a substrate including a first shared pixel region, a first isolation layer on the substrate, and a second isolation layer on the substrate. The first isolation layer that may define the first shared pixel region and the second isolation layer may be in the first shared pixel region. The first shared pixel region may include a plurality of photo-sensing devices in a plurality of sub-pixel regions. The first shared pixel region may include a first floating diffusion region connected to the plurality of photo-sensing devices included in the first shared pixel region. The plurality of sub-pixel regions in the first shared pixel region may include a first sub-pixel region and a second sub-pixel region that may be arranged side by side in a first direction and may constitute a first pixel group region. The plurality of sub-pixel regions in the first shared pixel region may include a third sub-pixel region and a fourth sub-pixel region that may be arranged side by side in the first direction and may constitute a second pixel group region. Each of the first pixel group region and the second pixel group region may be defined by a closed curved surface formed by the first isolation layer and the second isolation layer.

According to another aspect of inventive concepts, there is provided an image sensor. The image sensor may include a substrate including a first shared pixel region and an isolation layer on the substrate. The isolation layer may define the first shared pixel region. The first shared pixel region may include a plurality of photo-sensing devices in a plurality of sub-pixel regions. The first shared pixel region may include a first floating diffusion region. The plurality of photo-sensing devices included in the first shared pixel region may be connected to the first floating diffusion region. The plurality of sub-pixel regions may include a first sub-pixel region and a second sub-pixel region that may be arranged side by side in a first direction and may constitute a first pixel group region. The plurality of sub-pixel regions may include a third sub-pixel region and a fourth sub-pixel region that may be arranged side by side in the first direction and may constitute a second pixel group region. The substrate may include a well region doped with P-type impurities. The well region may be formed on a boundary region that may surround each of a center region of the first pixel group region and a center region of the second pixel group region. The well region may be spaced apart from the center region of the first pixel group region and the center region of the second pixel group region.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Embodiments will now be described fully with reference to the accompanying drawings.

Figure 1:
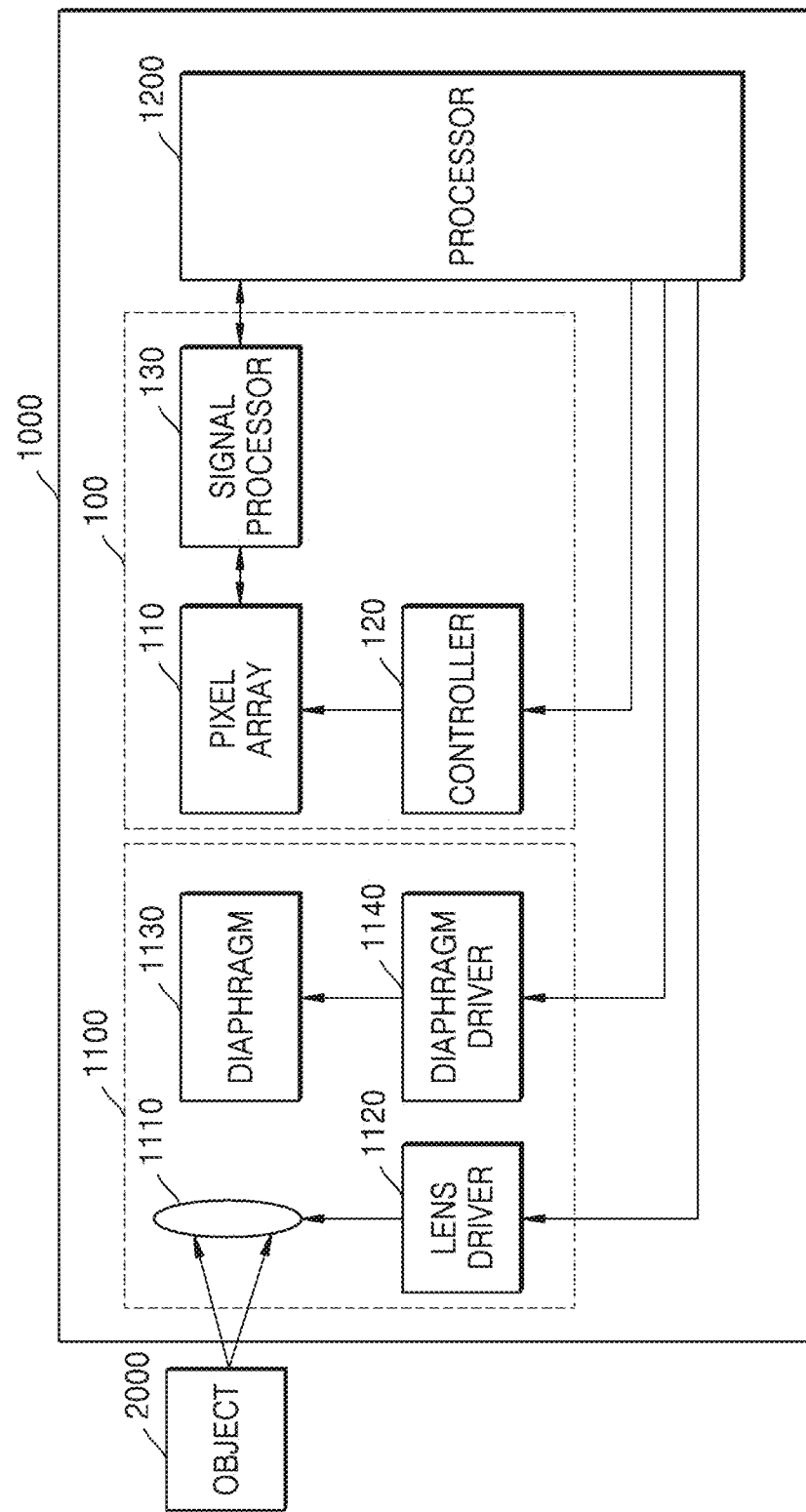
FIG. 1 is a block diagram of a structure of a digital photography apparatus according to an embodiment of inventive concepts.

FIG. 1 is a block diagram of a structure of a digital photography apparatus 1000 according to an embodiment of inventive concepts, for explaining execution of an auto-focus (AF) function of the digital photography apparatus 1000.

The digital photography apparatus 1000 may include an imaging unit 1100, an image sensor 100, and a processor 1200. The digital photography apparatus 1000 may include a focus detection function. The processor 1200 may be a hardware processor such as central processing unit (CPU), a multi-processor, a distributed processing system, an application specific integrated circuit (ASIC), and/or a suitable hardware processing unit, that when executing instructions according to firmware or software, configures the processor 1200 as a special purpose processor for controlling overall operations of the digital photography apparatus 1000. The processor may include a memory (not shown). The memory may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Overall operations of the digital photography apparatus 1000 may be controlled by the processor 1200. The processor 1200 may provide a lens driver 1120, a diaphragm driver 1140, a controller 120, and the like with control signals for respectively driving them.

The imaging unit 1100 is a component for receiving light, and may include a lens 1110, the lens driver 1120, a diaphragm 1130, and the diaphragm driver 1140. The lens 1110 may include a plurality of lenses. The hardware for the lens driver 1120 and the diaphragm driver 1140 are not particularly limited and may include one or more known circuits for performing the respective functions of the lens driver 1120 and diaphragm driver 1140 discussed hereafter.

The lens driver 1120 may communicate with the processor 1200 through information about focus detection, and may adjust the location of the lens 1110 according to a control signal provided by the processor 1200. The lens driver 1120 may move the lens 1110 in a direction in which a distance between the lens 1110 and an object 2000 increases or decreases. Accordingly, the distance between the lens 1110 and the object 2000 may be adjusted. The object 2000 may be focused or not focused according to a location of the lens 1110.

For example, when the distance between the lens 1110 and the object 2000 is relatively small, the lens 1110 may deviate from an in-focus position for focusing the object 2000, and a phase difference may occur between images formed on the image sensor 100. The lens driver 1120 may move the lens 1110 in a direction in which the distance between the lens 1110 and the object 2000 increases, based on the control signal provided by the processor 1200.

When the distance between the lens 1110 and the object 2000 is relatively large, the lens 1110 may deviate from the in-focus position, and a phase difference may occur between images formed on the image sensor 100. The lens driver 1120 may move the lens 1110 in a direction in which the distance between the lens 1110 and the object 2000 decreases, based on the control signal provided by the processor 1200.

The image sensor 100 may convert incident light into an image signal. The image sensor 100 may include a pixel array 110, the controller 120, and a signal processor 130. An optical signal that has passed through the lens 1110 and the diaphragm 1130 may form an image of a subject when reaching a light-receiving surface of the pixel array 110.

The pixel array 110 may be a complementary metal oxide semiconductor image sensor (CIS) which converts an optical signal to an electrical signal. Sensitivity or the like of the pixel array 110 may be controlled by the controller 120. The pixel array 110 may include shared pixels for performing an AF function or a distance measuring function.

The processor 1200 may receive first pixel information and second pixel information from the signal processor 130 to perform a phase difference calculation, and the phase difference calculation may be achieved by performing a correlation operation on pixel signals of a plurality of shared pixels. The processor 1200 may obtain the position of a focus, the direction of the focus, or a distance between the object 2000 and the image sensor 100, as a result of the phase difference calculation. The processor 1200 may output a control signal to the lens driver 1120 to move the location of the lens 1110, based on the result of the phase difference calculation.

The processor 1200 may reduce noise in an input signal and may perform image signal processing for image quality improvement, such as gamma correction, color filter array interpolation, color matrix, color correction, or color enhancement. The processor 1200 may generate an image file by compressing image data obtained by performing the image signal processing for image quality improvement, or may restore the image data from the image file.

Figure 2:
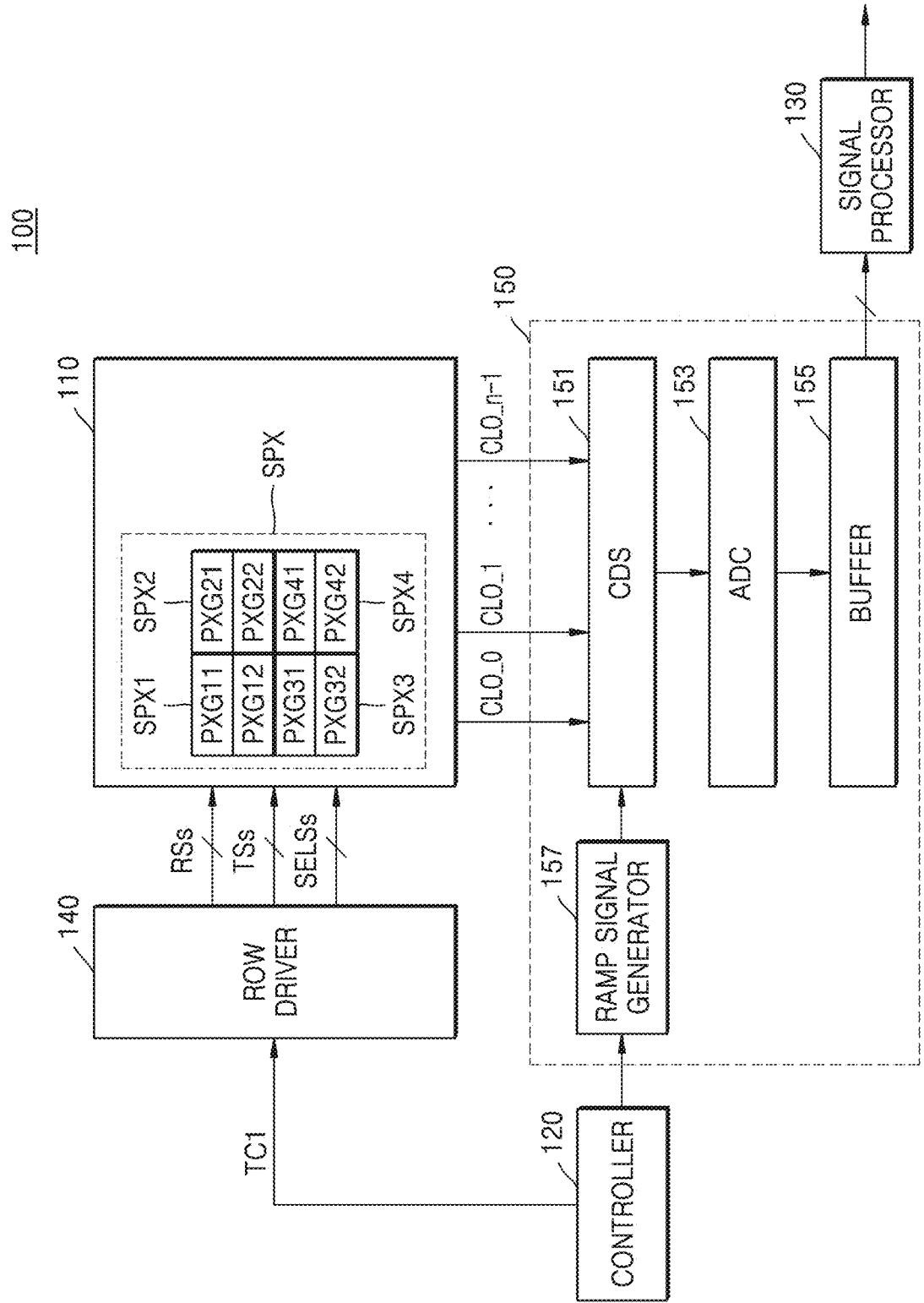
FIG. 2 is a block diagram of a structure of an image sensor according to an embodiment of inventive concepts.

FIG. 2 is a block diagram of a structure of the image sensor 100 according to an embodiment of inventive concepts.

Referring to FIG. 2, the image sensor 100 may include a pixel array 110, a controller 120, a signal processor 130, a row driver 140, and a signal reader 150. The signal reader 150 may include a correlated double sampler (CDS) 151, an analog-to-digital converter (ADC) 153, and a buffer 155.

The pixel array 110 may include a plurality of shared pixels SPX including first through fourth shared pixels SPX1 through SPX4. The plurality of shared pixels SPX may generate image signals corresponding to an object. An example circuit for the first shared pixel SPX1 and the second shared pixel SPX2 will be described later with reference to FIG. 3.

Each of the plurality of shared pixels SPX may output a pixel signal to the CDS 151 via corresponding first through n-th column output lines CLO_0 through CLO_n−1. For example, the first shared pixel SPX1 and the third shared pixel SPX3 may be connected to the first column output line CLO_0 and provide pixel signals to the CDS 151. The second shared pixel SPX2 and the fourth shared pixel SPX4 may be connected to the second column output line CLO_1 and provide pixel signals to the CDS 151. However, inventive concepts are not limited thereto, and the first through fourth shared pixels SPX1 through SPX4 may be connected to different column output lines, respectively.

According to an embodiment, the first through fourth shared pixels SPX1 through SPX4 may be phase detection pixels, and the first through fourth shared pixels SPX1 through SPX4 may generate phase signals that are used to calculate a phase difference between images. The first through fourth shared pixels SPX1 through SPX4 may be used to focus an object. The phase signals may include information about the locations of images formed on the image sensor 100, and may be used to calculate phase differences between the images. Based on the calculated phase differences, an in-focus position of the lens 1110 of FIG. 1 may be calculated. For example, a position of the lens 1110 of FIG. 1 that makes a phase difference be 0 may be the in-focus position.

The first through fourth shared pixels SPX1 through SPX4 may be used not only to focus the object but also to measure a distance between the object 2000 and the image sensor 100. To measure the distance between the object 2000 and the image sensor 100, additional pieces of information, such as phase differences between the images formed on the image sensor 100, the distance between the lens 1110 and the image sensor 100, the size of the lens 1110, and the in-focus position of the lens 1110, may be referred to.

Each of the plurality of shared pixels SPX may include a plurality of photo-sensing devices in a plurality of sub-pixels. According to an embodiment, each of the first through fourth shared pixels SPX1 through SPX4 may include four sub-pixels. Each of the plurality of sub-pixels may include a corresponding one of the plurality of photo-sensing devices, and the photo-sensing device included in each of the plurality of sub-pixels may absorb light and generate electric charges. For example, the photo-sensing device may be a photodiode.

The first shared pixel SPX1 may include a plurality of photodiodes and a first floating diffusion region shared by the plurality of photodiodes of the first shared pixel SPX1. Similar to the above description of the first shared pixel SPX1, each of the second through fourth shared pixels SPX2 through SPX4 may include a plurality of photodiodes and a floating diffusion region shared by the plurality of photodiodes.

According to an embodiment, each of the first through fourth shared pixels SPX1 through SPX4 may include first pixel groups PXG11, PXG21, PXG31, and PXG41, respectively, and second pixel groups PXG12, PXG22, PXG32, and PXG42, respectively. A below description of the first pixel group PXG11 and the second pixel group PXG12 of the first shared pixel SPX1 may be equally applied to the first pixel groups PXG21, PXG31, and PXG41 and the second pixel groups PXG22, PXG32, and PXG42 of the second through fourth shared pixel SPX2 through SPX4.

According to an embodiment, each of the first pixel group PXG11 and the second pixel group PXG12 of the first shared pixel SPX1 may include sub-pixels arranged side by side in a first direction, and the first pixel group PXG11 and the second pixel group PXG12 of the first shared pixel SPX1 may be arranged side by side in a second direction. An AF function in the second direction may be performed based on a first pixel signal output by the first pixel group PXG11 of the first shared pixel SPX1 and a second pixel signal output by the second pixel group PXG12 of the first shared pixel SPX1.

Alternatively, according to an embodiment, each of the first pixel group PXG11 and the second pixel group PXG12 of the first shared pixel SPX1 may include sub-pixels arranged side by side in the second direction, and the first pixel group PXG11 and the second pixel group PXG12 of the first shared pixel SPX1 may be arranged side by side in the first direction. An AF function in the first direction may be performed based on the first pixel signal output by the first pixel group PXG11 of the first shared pixel SPX1 and the second pixel signal output by the second pixel group PXG12 of the first shared pixel SPX1.

According to an embodiment, sub-pixel regions in which the first pixel group PXG11 included in the first shared pixel SPX1 is formed may share a first well region doped with first conductivity type impurities (for example, n-type impurities), and sub-pixel regions in which the second pixel group PXG12 included in the first shared pixel SPX1 is formed may share a first well region doped with the first conductivity type impurities. Accordingly, even when the sub-pixel regions are miniaturized, because the first well region is formed over sub-pixel regions where one pixel group (for example, PXG11 or PXG12) is formed, a pattern of the first well region may relatively enlarge. In the image sensor 100, the first well region may have a uniform pattern. In the image sensor 100, the sub-pixel regions where one pixel group is formed are formed to share a first well region, and thus, the full well capacity (FWC) of the photo-sensing devices may increase.

According to an embodiment, an isolation layer may not be arranged between the sub-pixel regions in which the first pixel group PXG11 included in the first shared pixel SPX1 is formed, and an isolation layer may not be arranged between the sub-pixel regions in which the second pixel group PXG12 included in the first shared pixel SPX1 is formed. In other words, at least two sub-pixel regions may be formed within an isolation layer that forms a closed curve. Accordingly, the image sensor 100 has no isolation layers between the sub-pixel regions where one pixel group (for example, the first or second pixel group PXG11 or PXG12) is formed, and thus, light scattering due to an isolation layer may be limited and/or prevented and a light-receiving region may increase.

The controller 120 may control the row driver 140 so that the pixel array 110 absorbs light to accumulate electric charges or temporarily stores the accumulated electric charges and outputs electrical signals corresponding to the stored accumulated electric charges to the outside of the pixel array 110. The controller 120 may also control the signal reader 150 to measure the level of a pixel signal provided by the pixel array 110.

The row driver 140 may generate signals for controlling the pixel array 110, namely, reset control signals RSs, transfer control signals TSs, and selection signals SELSs, and may provide the generated signals to the plurality of shared pixels SPX. According to an embodiment, the row driver 140 may determine activation and deactivation timing of the reset control signals RSs, the transfer control signals TSs, and the selection signals SELSs provided to the first through fourth shared pixels SPX1 through SPX4, based on whether to perform an AF function or a distance measuring function.

The CDS 151 may sample and hold the pixel signal provided by the pixel array 110. The CDS 151 may perform a double sampling on a level of certain noise and a level of the pixel signal to output a level corresponding to a difference between the level of the certain noise and the level of the pixel signal. In addition, the CDS 151 may receive a ramp signal generated by a ramp signal generator 157, compare the ramp signal with the level corresponding to the difference between the level of the certain noise and the level of the pixel signal, and output a result of the comparison to the ADC 153. The ADC 153 may convert an analog signal corresponding to the level of the result of the comparison received from the CDS 151 into a digital signal. The buffer 155 may latch the digital signal, and the latched digital signal may be sequentially output to the outside of the signal processor 130 or the image sensor 100.

The signal processor 130 may perform signal processing, based on pixel signals of the first through fourth shared pixels SPX1 through SPX4. For example, the signal processor 130 may perform noise reduction, gain adjustment, waveform shaping, interpolation, white balance adjustment, gamma correction, edge emphasis, and the like. The signal processor 130 may also perform a phase difference calculation for an AF operation by outputting signal-processed information to the processor 1200 during an AF operation. According to an embodiment, the signal processor 130 may be included in the processor 1200 of FIG. 1 outside the image sensor 100.

Figure 3:
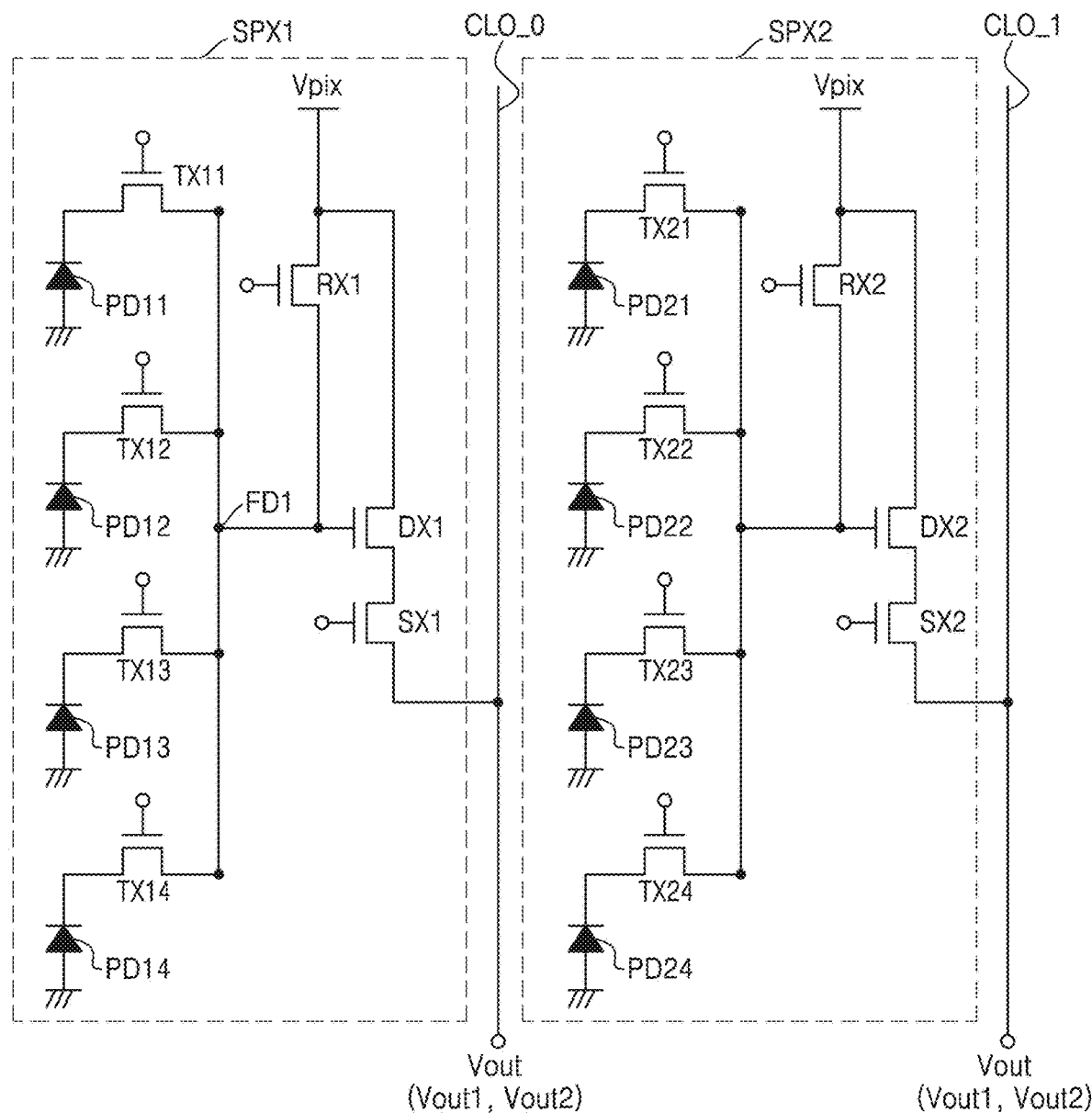
FIG. 3 is a circuit diagram of a first shared pixel and a second shared pixel included in a pixel array of FIG. 2, according to an embodiment of inventive concepts.

FIG. 3 is a circuit diagram of the first shared pixel SPX1 and the second shared pixel SPX2 included in the pixel array 110 of FIG. 2, according to an embodiment of inventive concepts. Although two shared pixels, namely, the first shared pixel SPX1 and the second shared pixel SPX2, are illustrated in FIG. 3, circuits of shared pixels other than the first shared pixel SPX1 and the second shared pixel SPX2 may be configured the same as the circuits of the first shared pixel SPX1 and the second shared pixel SPX2 illustrated in FIG. 3.

For convenience of explanation, only the first shared pixel SPX1 will now be described. However, the description of the first shared pixel SPX1 may be equally applied to the second shared pixel SPX2 and the other shared pixels. For example, descriptions of a plurality of photo-sensing devices PD11 through PD14, a plurality of transfer transistors TX11 through TX14, a select transistor SX1, a drive transistor DX1, and a reset transistor RX1 formed in the first shared pixel SPX1 may be equally applied to a plurality of photo-sensing devices PD21 through PD24, a plurality of transfer transistors TX21 through TX24, a select transistor SX2, a drive transistor DX2, and a reset transistor RX2 formed in the second shared pixel SPX2.

The first shared pixel SPX1 may include the plurality of photo-sensing devices PD11 through PD14, the plurality of transfer transistors TX11 through TX14, the select transistor SX1, the drive transistor DX1, and the reset transistor RX1. According to an embodiment, at least one of the reset transistor RX1, the drive transistor DX1, and the select transistor SX1 may be omitted. Although the first shared pixel SPX1 includes the four photo-sensing devices PD11 through PD14 and the four transfer transistors TX11 through TX14 in FIG. 3, inventive concepts are not limited thereto. According to embodiments, the respective numbers of photo-sensing devices and transfer transistors included in the first shared pixel SPX1 may vary.

Each of the photo-sensing devices PD11 through PD14 may generate a photocharge that varies according to the intensity of light. For example, the photo-sensing devices PD11 through PD14 are P-N junction diodes, and may generate electric charges, namely, electrons being negative charges and holes being positive charges, in proportion to the amount of incident light. Each of the photo-sensing devices PD11 through PD14 may be at least one of a photo transistor, a photo gate, a pinned photo diode (PDD), and a combination thereof.

The transfer transistors TX11 through TX14 may transfer the generated photocharges to a first floating diffusion region FD1, according to transfer control signals (for example, the transfer control signals TSs of FIG. 2). When the transfer transistors TX11 through TX14 are turned on, the photocharges respectively generated by the photo-sensing devices PD11 through PD14 included in the first shared pixel SPX1 may be transferred to the single first floating diffusion region FD1 and may be accumulated and stored in the first floating diffusion region FD1.

The reset transistor RX1 may periodically rest the electric charges accumulated in the first floating diffusion region FD1. A drain electrode of the reset transistor RX1 may be connected to the first floating diffusion region FD1, and a source electrode thereof may be connected to a power supply voltage Vpix. When the reset transistor RX1 is turned on according to reset control signals (for example, the reset control signals RSs of FIG. 2), the power supply voltage Vpix connected to the source electrode of the reset transistor RX1 is transmitted to the first floating diffusion region FD1. When the reset transistor RX1 is turned on, electric charges accumulated in the first floating diffusion region FD1 may be discharged, and thus, the first floating diffusion region FD1 may be reset.

The drive transistor DX1 may be controlled according to the number of photocharges accumulated in the first floating diffusion region FD1. The drive transistor DX1 is a buffer amplifier, and thus, may buffer a signal corresponding to the electric charges accumulated in the first floating diffusion region FD1. The drive transistor DX1 may amplify a change in a potential in the first floating diffusion region FD and may output the amplified potential change as a pixel signal Vout to the first column output line CLO_0.

The select transistor SX1 may have a drain terminal connected to a source terminal of the drive transistor DX1, and may output the pixel signal Vout to a CDS (for example, the CDS 151 of FIG. 2) via the first column output line CLO_0 in response to selection signals (for example, the selection signals SELSs of FIG. 2).

Each of the sub-pixels that constitute the first shared pixel SPX1 may include a corresponding photo-sensing device (for example, one of the photo-sensing devices PD11 through PD14) and a corresponding transfer transistor (for example, one of the transfer transistors TX11 through TX14). For example, a first sub-pixel included in the first shared pixel SPX1 may include the photo-sensing device PD11 and the transfer transistor TX11, a second sub-pixel included in the first shared pixel SPX1 may include the photo-sensing device PD12 and the transfer transistor TX12, a third sub-pixel included in the first shared pixel SPX1 may include the photo-sensing device PD13 and the transfer transistor TX13, and a fourth sub-pixel included in the first shared pixel SPX1 may include the photo-sensing device PD14 and the transfer transistor TX14.

The sub-pixels that constitute the first shared pixel SPX1 may share the first floating diffusion region FD1. The sharing by the first shared pixel SPX1 may include not only the plurality of photo-sensing devices PD1 through PD4 sharing the single first floating diffusion region FD1 but also sharing the reset transistor RX1, the drive transistor DX1, and the select transistor SX1 except for the transfer transistors TX1 through TX4.

Figure 4:
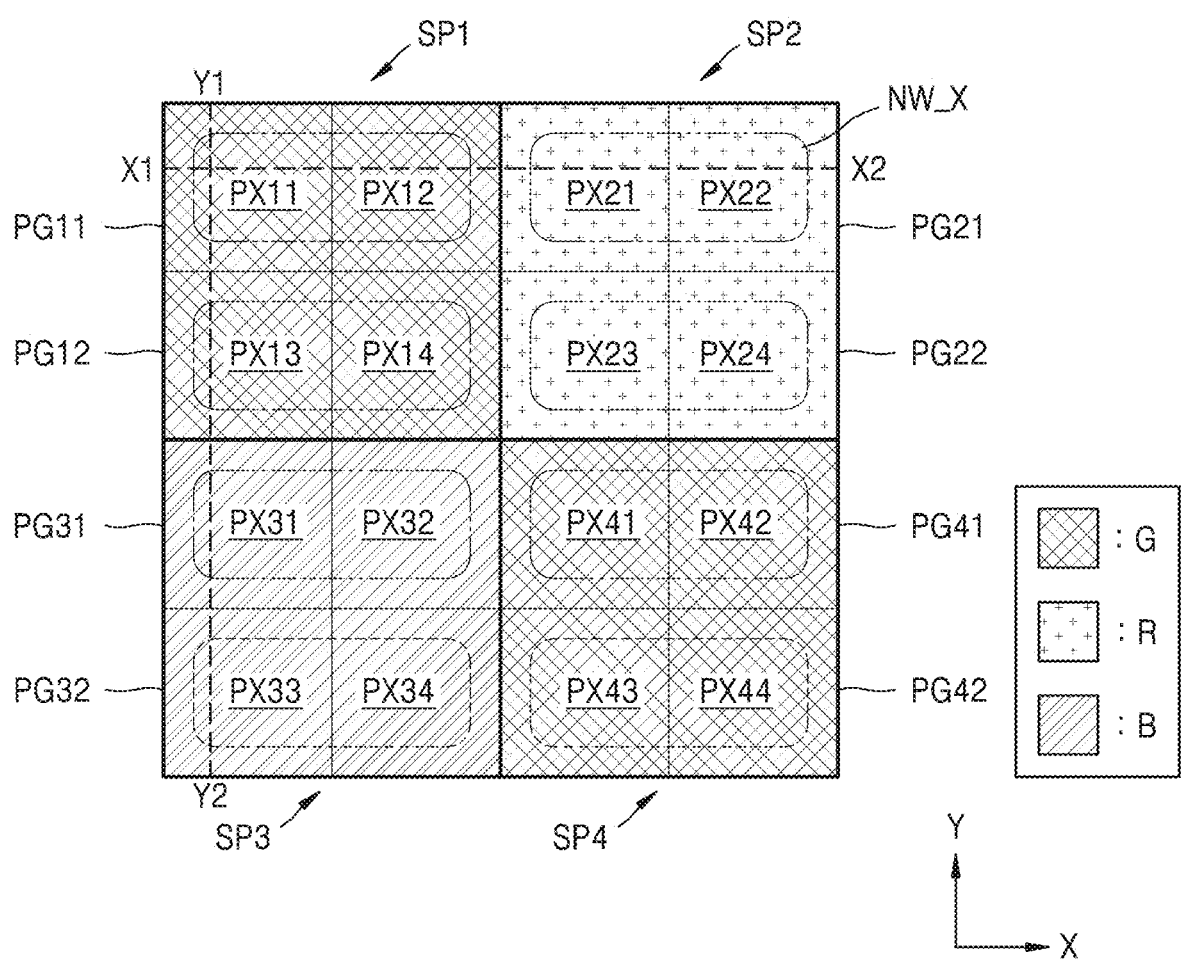
FIG. 4 illustrates a pixel array of an image sensor according to an embodiment of inventive concepts.

FIG. 4 is a schematic diagram of a pixel array of an image sensor according to an embodiment of inventive concepts, and illustrates a first pixel array 110a included in the pixel array 110 of FIG. 2. In FIG. 4, first through fourth shared pixel regions SP1 through SP4 may mean at least respective portions of the regions where corresponding shared pixels (for example, the first through fourth shared pixels SPX1 through SPX4 of FIG. 2) are formed, respectively. First group pixel regions PG11 through PG41 and second group pixel regions PG12 through PG42 may mean at least respective portions of the regions where corresponding group pixels (for example, PXG11, PXG21, PXG31, PXG41, PXG12, PXG22, PXG32, and PXG42 of FIG. 2) are respectively formed, and a plurality of sub-pixel regions, namely, first through fourth sub-pixel regions PX11 through PX14, first through fourth sub-pixel regions PX21 through PX24, first through fourth sub-pixel regions PX31 through PX34, and first through fourth sub-pixel regions PX41 through PX44, may mean at least respective portions of the regions where sub-pixels are respectively formed.

Referring to FIGS. 3 and 4, the first pixel array 110a may include the first through fourth sub-pixel regions PX11 through PX14, the first through fourth sub-pixel regions PX21 through PX24, the first through fourth sub-pixel regions PX31 through PX34, and the first through fourth sub-pixel regions PX41 through PX44 arranged in a row direction (for example, the first direction X) and a column direction (for example, the second direction Y). According to an embodiment, a single shared pixel region may be defined as a unit including four sub-pixel regions arranged in two rows and two columns. Accordingly, the single shared pixel region may include four photo-sensing devices respectively formed in the four sub-pixel regions.

The first pixel array 110a may include the first through fourth shared pixel regions SP1 through SP4. The first pixel array 110a may include a color filter such that the first through fourth shared pixel regions SP1 through SP4 may sense various colors. According to an embodiment, the color filter may include filters that sense red (R), green (G), and blue (B), and each of the first through fourth shared pixel regions SP1 through SP4 may include sub-pixel regions in which the same color is arranged.

According to an embodiment, the first through fourth shared pixel regions SP1 through SP4 may be arranged to correspond to a Bayer pattern, within the first pixel array 110a. For example, the first shared pixel region SP1 and the fourth shared pixel region SP4 may include the first through fourth sub-pixel regions PX11 through PX14 and the first through fourth sub-pixel regions PX41 through PX44 including a green (G) color filter, the second shared pixel region SP2 may include the first through fourth sub-pixel regions PX21 through PX24 including an red (R) color filter, and the third shared pixel region SP3 may include the first through fourth sub-pixel regions PX31 through PX34 including a blue (B) color filter.

However, this is merely an embodiment, and thus, the first pixel array 110a according an embodiment of inventive concepts may include various other types of color filters. For example, the color filter may include filters for sensing yellow, cyan, and magenta colors. Alternatively, the color filter may include filters for sensing red, green, blue and white colors. The first pixel array 110a may include more shared pixel regions than those shown in FIG. 4 and the first through fourth shared pixel regions SP1 through SP4 may be arranged in various layouts, and inventive concepts is not limited to the layout of FIG. 4.

According to an embodiment, in the first through fourth shared pixel regions SP1 through SP4, the first pixel group regions PG11, PG21, PG31, and PG41 and the second pixel group regions PG12, PG22, PG32, and PG42 may be formed, respectively. For convenience of explanation, only the first shared pixel region SP1 will now be described. However, the description of the first shared pixel region SP1 may be equally applied to the second through fourth shared pixel regions SP2 through SP4. For example, a description of the first pixel group region PG11 of the first shared pixel region SP1 is applicable to each of the first pixel group regions PG21, PG31, and PG41 of the second through fourth shared pixel regions SP2 through SP4, and a description of the second pixel group region PG12 of the first shared pixel region SP1 is applicable to each of the second pixel group regions PG22, PG32, and PG42 of the second through fourth shared pixel regions SP2 through SP4.

The first shared pixel region SP1 may include the first pixel group region PG11 including the first sub-pixel region PX11 and the second sub-pixel region PX12 arranged in a first row, and the second pixel group region PG12 including the third sub-pixel region PX13 and the fourth sub-pixel region PX14 arranged in a second row. The first pixel group region PG11 and the second pixel group region PG12 of the first shared pixel region SP1 may be arranged side by side in the second direction Y, which is a column direction.

The first sub-pixel region PX11 and the second sub-pixel region PX12 may share a first well region NW_X doped with first conductivity type impurities (for example, n-type impurities). The third sub-pixel region PX13 and the fourth sub-pixel region PX14 may share another first well region NW_X doped with first conductivity type impurities. The first well region NW_X formed in the first pixel group region PG11 and the first well region NW_X formed in the second pixel group region PG12 may be spaced apart from each other. The sub-pixels included in a single pixel group are formed to share the first well region NW_X, and thus respective FWCs of the first pixel group region PG11 and the second pixel group region PG12 may increase. When an image sensor is manufactured, a pattern of the first well region NW_X may relatively enlarge, and thus, the first well region NW_X may have a uniform pattern.

When the image sensor performs an AF function or a distance measuring function, transfer transistors TX11 and TX12 of the first sub-pixel region PX11 and the second sub-pixel region PX12 included in the first pixel group region PG11 may be turned on together. Photocharges generated in a photo-sensing device PD11 of the first sub-pixel region PX11 and a photo-sensing device PD12 of the second sub-pixel region PX12 may be transmitted to a first floating diffusion region FD1, and a first pixel signal Vout1 corresponding to the photocharges may be output to the first column output line CLO_0.

When the image sensor performs an AF function or a distance measuring function, transfer transistors TX13 and TX14 of the third sub-pixel region PX13 and the fourth sub-pixel region PX14 included in the second pixel group region PG12 may be turned on together. Photocharges generated in a photo-sensing device PD13 of the third sub-pixel region PX13 and a photo-sensing device PD14 of the fourth sub-pixel region PX14 may be transmitted to the first floating diffusion region FD1, and a second pixel signal Vout2 corresponding to the photocharges may be output to the first column output line CLO_0.

According to an embodiment, a processor (for example, the processor 1200 of FIG. 1) may receive first pixel information corresponding to the first pixel signal Vout1 output by each of the first pixel group regions PG11, PG21, PG31, and PG41 of the first through fourth shared pixel regions SP1 through SP4, and may receive second pixel information corresponding to the second pixel signal Vout2 output by each of the second pixel group regions PG12, PG22, PG32, and PG42 of the first through fourth shared pixel regions SP1 through SP4. The processor 1200 may perform an AF operation of the second direction Y, which is a column direction, or a distance measuring operation of the second direction Y, by using the first pixel information and the second pixel information.

For example, the processor 1200 may calculate a phase difference by using first information UI and second information DI derived from Equation 1 below, and may perform an AF operation of the second direction Y or a distance measuring operation of the second direction Y. For example, the first information UI and the second information DI may mean upper information and lower information in the present drawing.

$$UI=f(Vout\_1\_PG11, Vout\_1\_PG21, Vout\_1\_PG31, Vout\_1\_PG41)$$

$$DI=f(Vout\_2\_PG12, Vout\_2\_PG22, Vout\_2\_PG32, Vout\_2\_PG42) \quad \text{[Equation 1]}$$

where Vout_1_PG11 may be a first pixel signal output by the first pixel group region PG11 of the first shared pixel region SP1, Vout_1_PG21 may be a first pixel signal output by the first pixel group region PG21 of the second shared pixel region SP2, Vout_1_PG31 may be a first pixel signal output by the first pixel group region PG31 of the third shared pixel region SP3, and Vout_1_PG41 may be a first pixel signal output by the first pixel group region PG41 of the fourth shared pixel region SP4. In Equation 1, Vout_2_PG12 may be a second pixel signal output by the second pixel group region PG12 of the first shared pixel region SP1, Vout_2_PG22 may be a second pixel signal output by the second pixel group region PG22 of the second shared pixel region SP2, Vout_2_PG32 may be a second pixel signal output by the second pixel group region PG32 of the third shared pixel region SP3, and Vout_2_PG42 may be a second pixel signal output by the second pixel group region PG42 of the fourth shared pixel region SP4. A function f for deriving the first information UI and the second information DI may have various configurations.

The processor 1200 may not perform an AF operation of the second direction Y or a distance measuring operation of the second direction Y by using pixel signals respectively output by sub-pixels, but may perform an AF operation of the second direction Y or a distance measuring operation of the second direction Y by using pixel signals respectively output by group pixels. The number of calculations performed by the processor 1200 to accomplish an AF operation of the second direction Y or a distance measuring operation of the second direction Y may be reduced.

Figure 5A:
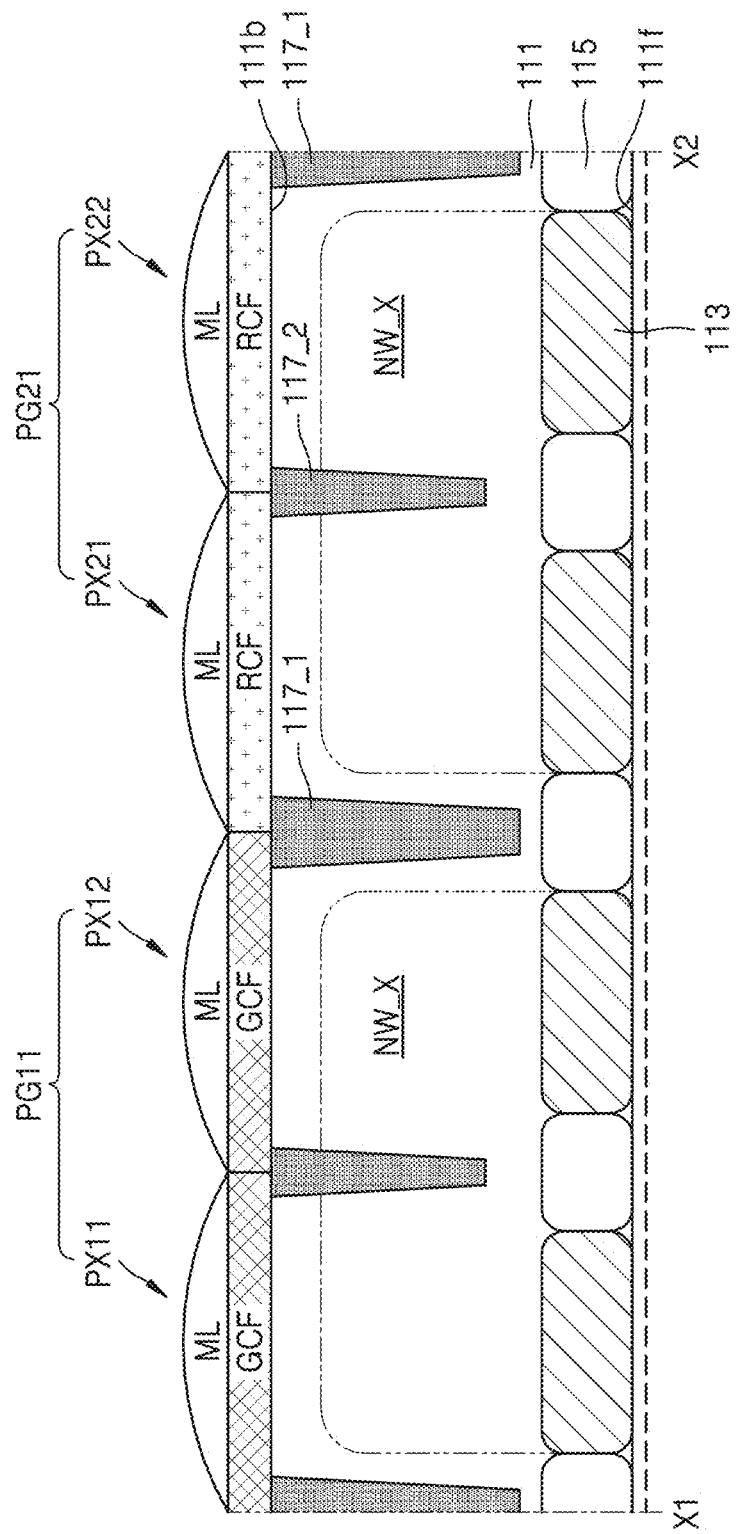
FIG. 5A is a cross-sectional view taken along line X1-X2 of FIG. 4
Figure 5B:
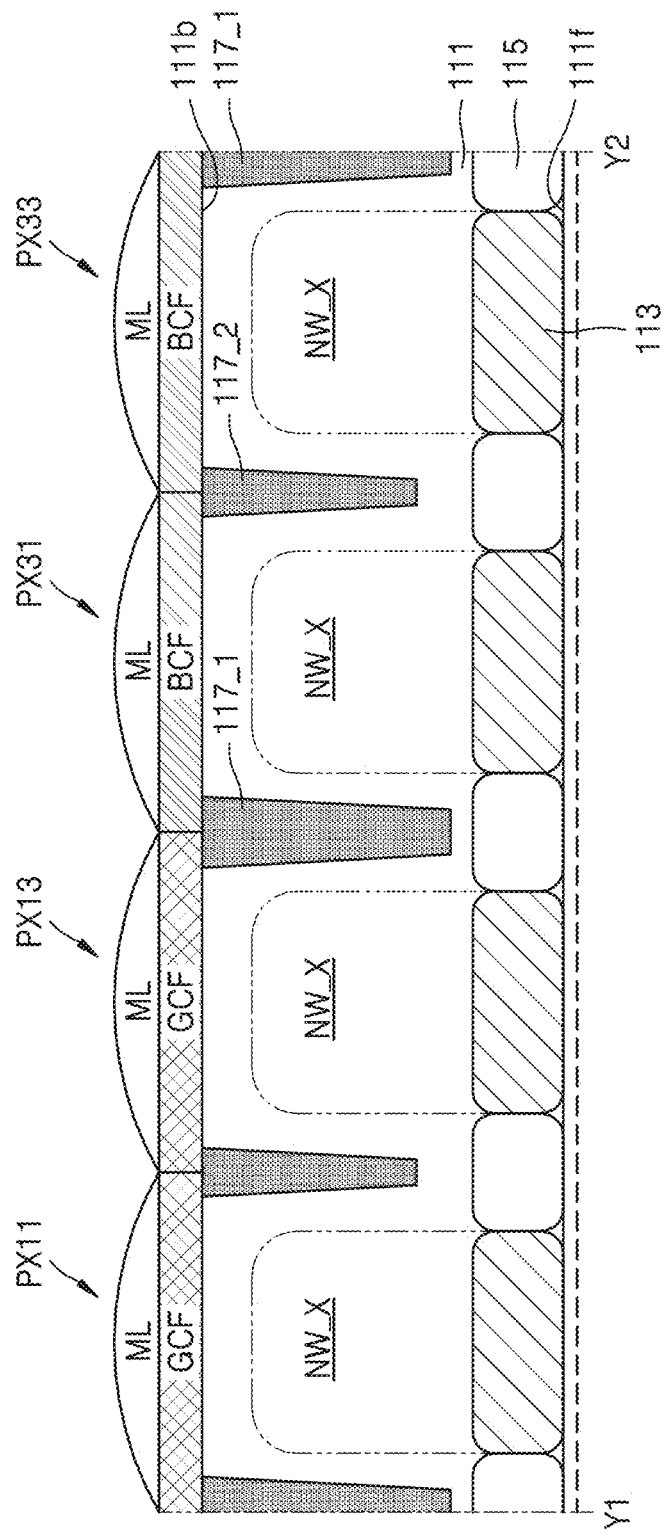
FIG. 5B is a cross-sectional view taken along line Y1-Y2 of FIG. 4.

FIGS. 5A and 5B illustrate a pixel array of an image sensor according to an embodiment of inventive concepts, wherein FIG. 5A is a cross-sectional view taken along line X1-X2 of FIG. 4 and FIG. 5B is a cross-sectional view taken along line Y1-Y2 of FIG. 4.

Referring to FIGS. 4, 5A, and 5B, a semiconductor substrate 111, on which the first through fourth sub-pixel regions PX11 through PX14, the first through fourth sub-pixel regions PX21 through PX24, the first through fourth sub-pixel regions PX31 through PX34, and the first through fourth sub-pixel regions PX41 through PX44 are formed, may be provided. The semiconductor substrate 111 may have a first surface 111f and a second surface 111b opposite to each other. For example, the first surface 111f may be a front surface of the semiconductor substrate 111, and the second surface 111b may be a rear surface of the semiconductor substrate 111. Circuits may be arranged on the first surface 111f, and light may be incident upon the second surface 111b.

According to an embodiment, the semiconductor substrate 111 may be, but is not limited to, a silicon epitaxial layer doped with second conductivity type impurities (for example, p-type impurities). FIGS. 5A and 5B illustrate a photo-sensing region in which a photo-sensing device is formed, but a transfer transistor and the like may be further formed in the photo-sensing region.

Photo-sensing regions 113 may be arranged within the semiconductor substrate 111. A single photo-sensing region 113 may be formed in each of the first through fourth sub-pixel regions PX11 through PX14, the first through fourth sub-pixel regions PX21 through PX24, the first through fourth sub-pixel regions PX31 through PX34, and the first through fourth sub-pixel regions PX41 through PX44. For example, a single photo-sensing region 113 may be formed in each of the first sub-pixel region PX11, the second sub-pixel region PX12, the third sub-pixel region PX13, and the fourth sub-pixel region PX14 of the first shared pixel region SP1. The photo-sensing regions 113 may be arranged in the first direction X and the second direction Y to form a matrix, from a planar viewpoint.

The photo-sensing regions 113 may be formed by ion-implanting impurities of a first conductivity type (for example, an n type) into the semiconductor substrate 111. According to an embodiment, photo-sensing devices, namely, photodiodes, may be formed due to junction of the photo-sensing regions 113 of a first conductivity type and the semiconductor substrate 111 of a second conductivity type. However, inventive concepts are not limited thereto, and photo-sensing devices may be formed due to junction of another component doped with the second conductivity type impurities and the photo-sensing regions 113 of the first conductivity type.

The first well region NW_X having the first conductivity type may be formed on the photo-sensing regions 113. The first well region NW_X may be formed by ion-implanting impurities of the first conductivity type into the semiconductor substrate 111. A doping concentration of the first well region NW_X may be lower than that of the photo-sensing regions 113. Because the photo-sensing regions 113 may receive electric charges from the first well region NW_X, FWCs of the photo-sensing regions 113 may increase.

The first well region NW_X may be formed over the sub-pixel regions included in the same pixel group region. For example, a single first well region NW_X may be formed over the first sub-pixel region PX11 and the second sub-pixel region PX12 included in the first pixel group region PG11 of the first shared pixel region SP1. Sub-pixel regions included in different pixel groups may include first well regions NW_X spaced apart from each other, respectively. Electric charges generated in the first sub-pixel region PX11 and electric charges generated in the second sub-pixel region PX12 may move between each other via the first well region NW_X.

A separation impurity layer 115 may be formed by ion-implanting impurities of a second conductivity type into the semiconductor substrate 111. A concentration of the second conductivity type impurities in the separation impurity layer 115 may be greater than that in the semiconductor substrate 111. The separation impurity layer 115 may include first portions each extending in the first direction X and second portions each extending in the second direction Y, and, for example, may be formed in a lattice shape.

The separation impurity layer 115 may surround the photo-sensing regions 113. For example, the separation impurity layer 115 may be formed between photo-sensing regions 113 adjacent to each other in the first direction X, and the separation impurity layers 115 may be formed between photo-sensing regions 113 adjacent to each other in the second direction Y.

The separation impurity layer 115 having an opposite conductivity type to the photo-sensing regions 113 may provide a potential barrier between the photo-sensing regions 113. In other words, potential wells may be formed in the photo-sensing regions 113 by the separation impurity layer 115. The photo-sensing regions 113 may be separated from each other by the separation impurity layer 115.

First isolation layers 117_1 and second isolation layers 117_2 may be formed within the semiconductor substrate 111. According to an embodiment, the first isolation layers 117_1 and the second isolation layers 117_2 may each extend perpendicularly from the second surface 111b of the semiconductor substrate 111. According to an embodiment, the first isolation layers 117_1 and the second isolation layers 117_2 may each extend perpendicularly from the first surface 111f of the semiconductor substrate 111. The first isolation layers 117_1 and the second isolation layers 117_2 may have various shapes and may be manufactured according to various processes.

According to an embodiment, the first isolation layers 117_1 may be formed to have greater widths than the second isolation layers 117_2. According to an embodiment, the first isolation layers 117_1 may be formed more deeply than the second isolation layers 117_2. However, inventive concepts are not limited thereto, and the first isolation layers 117_1 and the second isolation layers 117_2 may have the same shapes and may be formed via the same process.

The first isolation layers 117_1 and the second isolation layers 117_2 may be formed of an insulating material having a lower refractive index than that of a material used to form the semiconductor substrate 111. For example, the first isolation layers 117_1 and the second isolation layers 117_2 may include silicon oxide, silicon nitride, undoped polysilicon, air, or a combination thereof.

The first isolation layers 117_1 and the second isolation layers 117_2 may refract incident light that is incident upon sub-pixel regions. The first isolation layers 117_1 and the second isolation layers 117_2 may limit and/or prevent photocharges generated from the incident light from moving to adjacent sub-pixel regions due to random drift.

The first isolation layers 117_1 may be formed to surround each of the first through fourth shared pixel regions SP1 through SP4. In other words, the first isolation layers 117_1 may define a single shared pixel region. For example, a first isolation layer 117_1 extending in the second direction Y may be formed between the first shared pixel region SP1 and the second shared pixel region SP2, and a first isolation layer 117_1 extending in the first direction X may be formed between the first shared pixel region SP1 and the third shared pixel region SP3.

The second isolation layers 117_2 may be formed within the first through fourth shared pixel regions SP1 through SP4. Each second isolation layer 117_2 may be formed between different sub-pixel regions. For example, a second isolation layer 117_2 extending in the second direction Y may be formed between the first sub-pixel region PX11 and the second sub-pixel region PX12 of the first shared pixel region SP1, and a second isolation layer 117_2 extending in the first direction X may be formed between the first sub-pixel region PX11 and the third sub-pixel region PX13 of the first shared pixel region SP1.

According to an embodiment, the second isolation layers 117_2 may not be formed between sub-pixel regions included in the same pixel group, and the second isolation layers 117_2 may be formed between sub-pixel regions included in different pixel groups. For example, no second isolation layers 117_2 may be formed between the first sub-pixel region PX11 and the second sub-pixel region PX12 included in the first pixel group region PG11 of the first shared pixel region SP1.

Color filter layers GCF, RCF, and BCF and micro-lenses ML may be arranged on the second surface 111b of the semiconductor substrate 111. Green color filter layers GCF may be arranged in the first shared pixel region and the fourth shared pixel region, a red color filter layer RCF may be arranged in the second shared pixel region, and a blue color filter layer BCF may be arranged in the third shared pixel region. In other words, the same color filter layers may be arranged in the sub-pixel regions included in the same shared pixel region.

The color filter layers GCF, RCF, and BCF may be formed to correspond to the sub-pixel regions, and the microlenses ML may also be formed to correspond to the sub-pixel regions. For example, the sub-pixel regions may include different microlenses ML, respectively.

Figure 6:
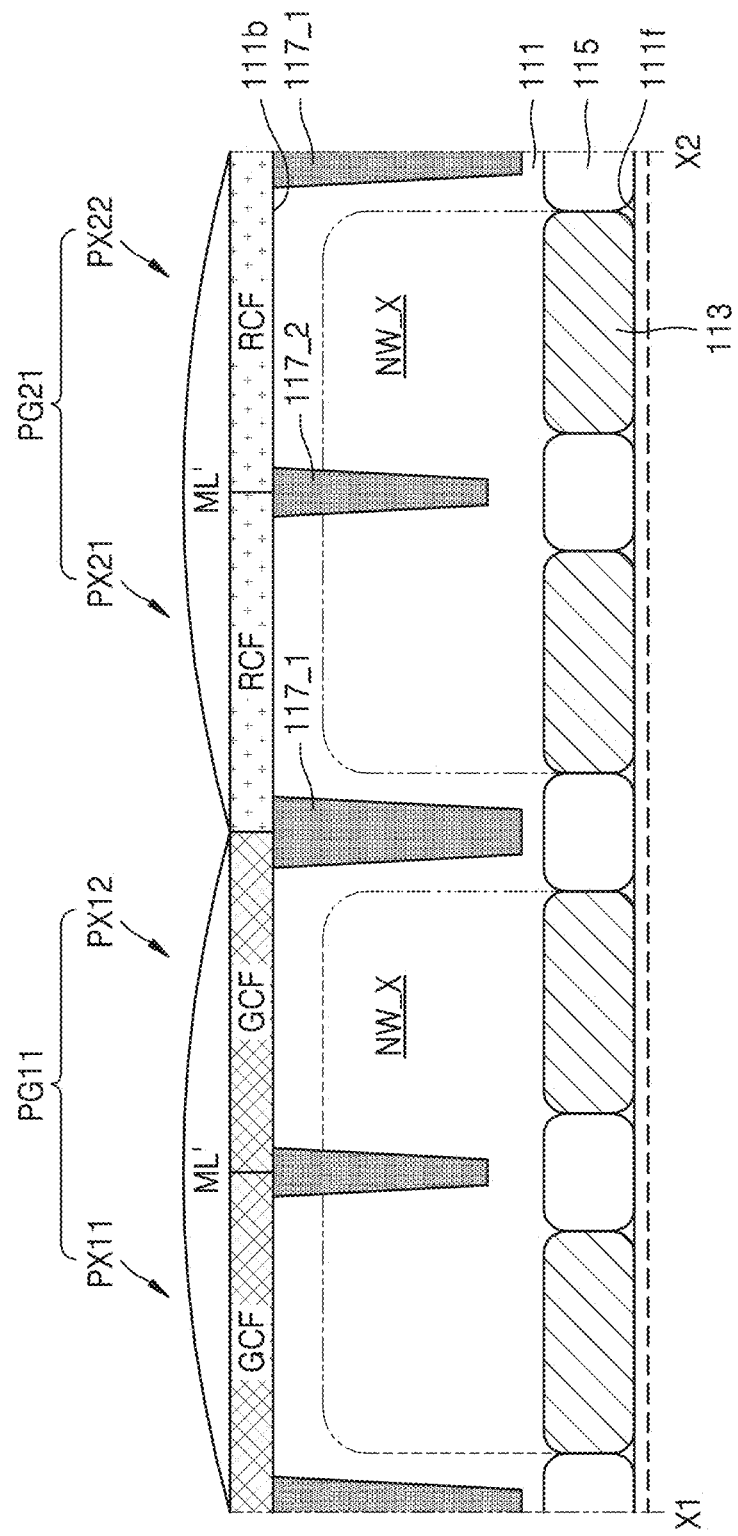
FIG. 6 illustrates a pixel array of an image sensor according to an embodiment of inventive concepts, and is a cross-sectional view taken along line X1-X2 of FIG. 4.

FIG. 6 illustrates a pixel array of an image sensor according to an embodiment of inventive concepts, and is a cross-sectional view taken along line X1-X2 of FIG. 4. Reference numerals of FIG. 6 that are the same as those of FIG. 5A will not be described again here.

Referring to FIGS. 4 and 6, the color filter layers GCF, RCF, and BCF and micro-lenses ML' may be arranged on the second surface 111b of the semiconductor substrate 111. According to an embodiment, each microlens ML' may be formed to correspond to each pixel group region. For example, a single microlens ML' may be arranged in the first pixel group region PG11 of the first shared pixel region SP1, and a single microlens ML' may be arranged in the second pixel group region PG12 of the first shared pixel region SP1. In this case, a microlens MU that is different from the microlens ML' of the first pixel group region PG11 may be arranged in the second pixel group region PG12 of the first shared pixel region SP1.

According to an embodiment, each microlens ML' may be formed to correspond to each shared pixel region. For example, a single microlens MU may be arranged in each of the first through fourth shared pixel regions SP1 through SP4.

Figure 7:
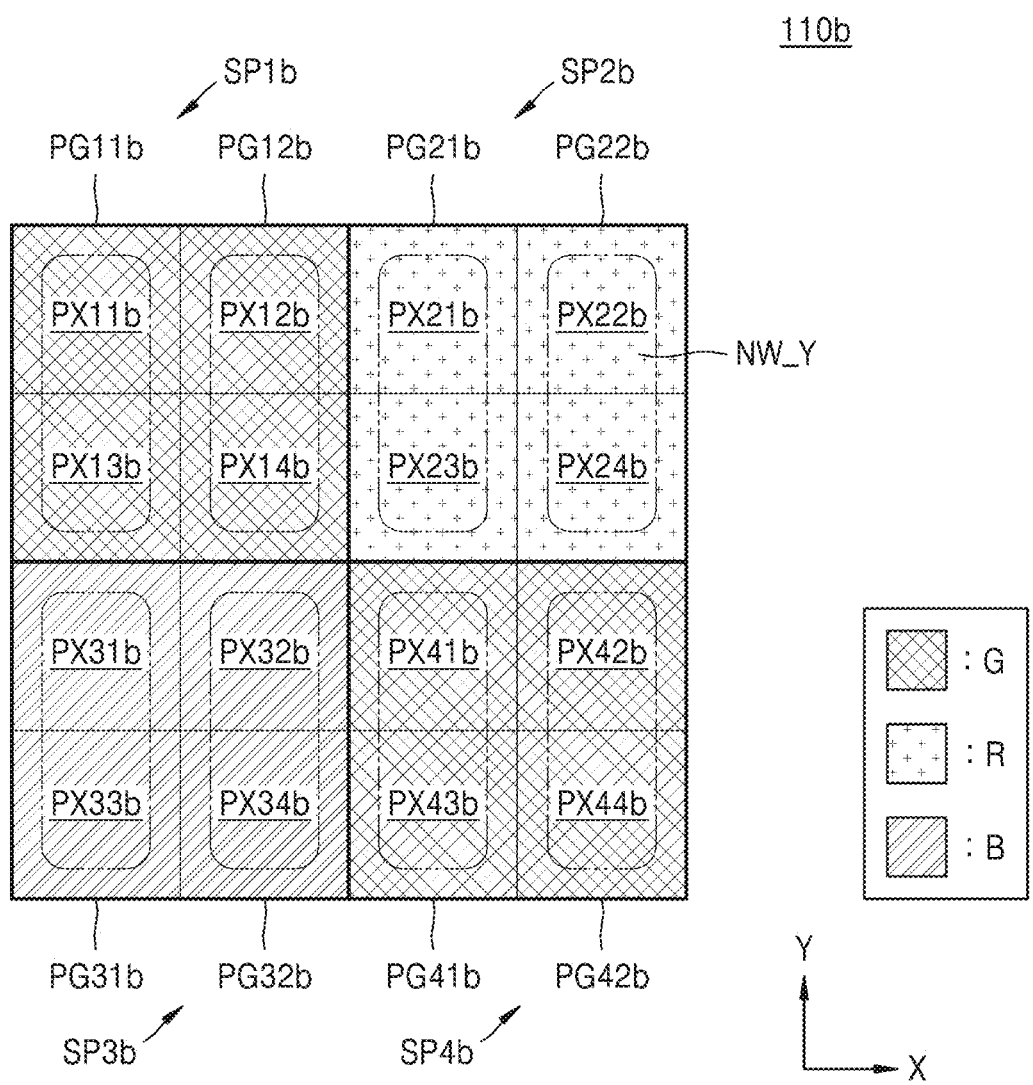
FIG. 7 illustrates a pixel array of an image sensor according to an embodiment of inventive concepts.

FIG. 7 is a schematic diagram of a pixel array of an image sensor according to an embodiment of inventive concepts, and illustrates a second pixel array 110b included in the pixel array 110 of FIG. 2.

Referring to FIG. 7, the second pixel array 110b may include first through fourth shared pixel regions SP1b through SP4b. Each of the first through fourth shared pixel regions SP1b through SP4b may include sub-pixel regions in which the same color filter is arranged.

According to an embodiment, in the first through fourth shared pixel regions SP1b through SP4b, first pixel group regions PG11b, PG21b, PG31b, and PG41b and second pixel group regions PG12b, PG22b, PG32b, and PG42b may be formed, respectively. For convenience of explanation, only the first shared pixel region SP1b will now be described. However, the description of the first shared pixel region SP1b may be equally applied to the second through fourth shared pixel regions SP2b through SP4b.

The first shared pixel region SP1b may include the first pixel group region PG11b including a first sub-pixel region PX11b and a third sub-pixel region PX13b arranged in a first column, and the second pixel group region PG12b including a second sub-pixel region PX12b and a fourth sub-pixel region PX14b arranged in a second column. The first pixel group region PG11b and the second pixel group region PG12b of the first shared pixel region SP1b may be arranged side by side in the first direction X, which is a row direction.

The first sub-pixel region PX11b and the third sub-pixel region PX13b may share a first well region NW_Y doped with first conductivity type impurities (for example, n-type impurities). The second sub-pixel region PX12b and the fourth sub-pixel region PX14b may share another first well region NW_Y doped with first conductivity type impurities. The first well region NW_Y formed in the first pixel group region PG11b and the first well region NW_Y formed in the second pixel group region PG12b may be apart from each other. Accordingly, the sub-pixels included in a single pixel group region (PG11b or PG12b) are formed to share the first well region NW_Y, and thus, respective FWCs of the first pixel group region PG11b and the second pixel group region PG12b may increase.

When the image sensor performs an AF function or a distance measuring function, transfer transistors TX11 and TX13 of the first sub-pixel region PX11b and the third sub-pixel region PX13b included in the first pixel group region PG11b may be turned on together. Photocharges generated in a photo-sensing device PD11 of the first sub-pixel region PX11b and a photo-sensing device PD13 of the third sub-pixel region PX13b may be transmitted to a first floating diffusion region FD1, and a first pixel signal (for example, the first pixel signal Vout1 of FIG. 3) corresponding to the photocharges may be output to a first column output line (for example, the first column output line CLO_0 of FIG. 3).

When the image sensor performs an AF function or a distance measuring function, transfer transistors TX12 and TX14 of the second sub-pixel region PX12b and the fourth sub-pixel region PX14b included in the second pixel group region PG12b may be turned on together. Photocharges generated in a photo-sensing device PD12 of the second sub-pixel region PX12b and a photo-sensing device PD14 of the fourth sub-pixel region PX14b may be transmitted to the first floating diffusion region FD1, and a second pixel signal (for example, the second pixel signal Vout2 of FIG. 3) corresponding to the photocharges may be output to the first column output line CLO_0.

According to an embodiment, a processor (for example, the processor 1200 of FIG. 1) may receive first pixel information corresponding to the first pixel signal Vout1 output by each of the first pixel group regions PG11b, PG21b, PG31b, and PG41b of the first through fourth shared pixel regions SP1b through SP4b, and may receive second pixel information corresponding to the second pixel signal Vout2 output by each of the second pixel group regions PG12b, PG22b, PG32b, and PG42b of the first through fourth shared pixel regions SP1b through SP4b. The processor 1200 may perform an AF operation of the first direction X, which is a row direction, or a distance measuring operation of the first direction X, by using the first pixel information and the second pixel information.

For example, the processor 1200 may calculate a phase difference by using third information LI and fourth information RI derived from Equation 2 below, and may perform an AF operation of the first direction X or a distance measuring operation of the first direction X. For example, the third information LI and the fourth information RI may mean left information and right information in the present drawing.

$$LI=f(Vout\_1\_PG11b, Vout\_1\_PG21b, Vout\_1\_PG31b, Vout\_1\_PG41b)$$

$$RI=f(Vout\_2\_PG12b, Vout\_2\_PG22b, Vout\_2\_PG32b, Vout\_2\_PG42b)$$ [Equation 2]

where Vout_1_PG11b may be a first pixel signal output by the first pixel group region PG11b of the first shared pixel region SP1b, Vout_1_PG21b may be a first pixel signal output by the first pixel group region PG21b of the second shared pixel region SP2b, Vout_1_PG31b may be a first pixel signal output by the first pixel group region PG31b of the third shared pixel region SP3b, and Vout_1_PG41b may be a first pixel signal output by the first pixel group region PG41b of the fourth shared pixel region SP4b. In Equation 2, Vout_2_PG12b may be a second pixel signal output by the second pixel group region PG12b of the first shared pixel region SP1b, Vout_2_PG22b may be a second pixel signal output by the second pixel group region PG22b of the second shared pixel region SP2b, Vout_2_PG32b may be a second pixel signal output by the second pixel group region PG32b of the third shared pixel region SP3b, and Vout_2_PG42b may be a second pixel signal output by the second pixel group region PG42b of the fourth shared pixel region SP4b. A function f for deriving the third information LI and the fourth information RI may have various configurations.

The processor 1200 may not perform an AF operation of the first direction X or a distance measuring operation of the first direction X by using pixel signals respectively output by sub-pixels, but may perform an AF operation of the first direction X or a distance measuring operation of the first direction X by using pixel signals respectively output by group pixels. The number of calculations performed by the processor 1200 to accomplish an AF operation of the first direction X or a distance measuring operation of the first direction X may be reduced.

According to an embodiment, a pixel array (for example, the pixel array 110 of FIG. 2) of an image sensor may include both the first pixel array 110a of FIG. 4 and the second pixel array 110b of FIG. 7, and the image sensor may perform respective AF functions of the first direction X and the second direction Y or respective distance measuring functions of the first direction X and the second direction Y. According to an embodiment, a pixel array of an image sensor according to inventive concepts may include the first pixel array 110a and the second pixel array 110b arranged adjacent to each other.

Figure 8:
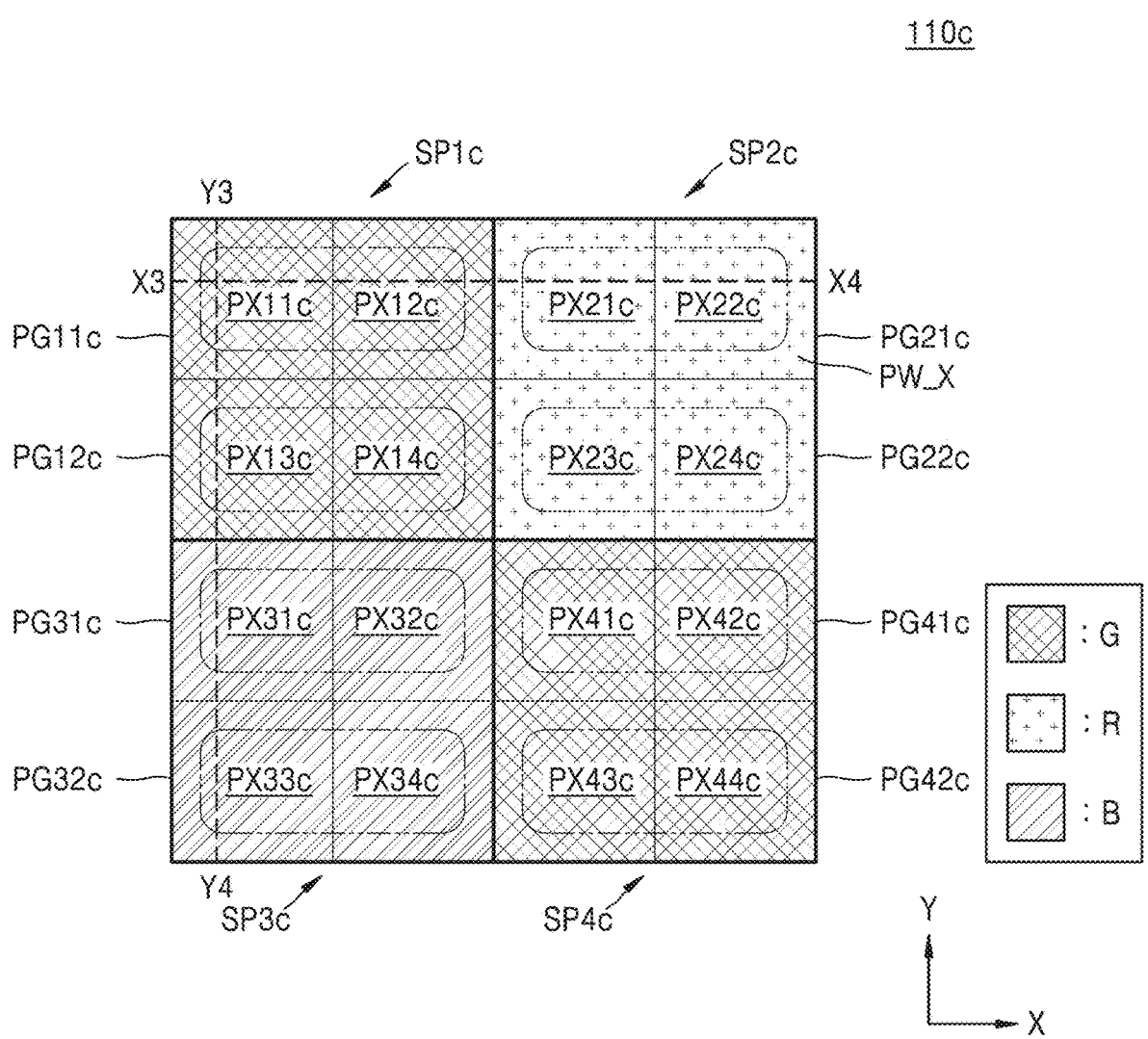
FIG. 8 illustrates a pixel array of an image sensor according to an embodiment of inventive concepts.
Figure 9A:
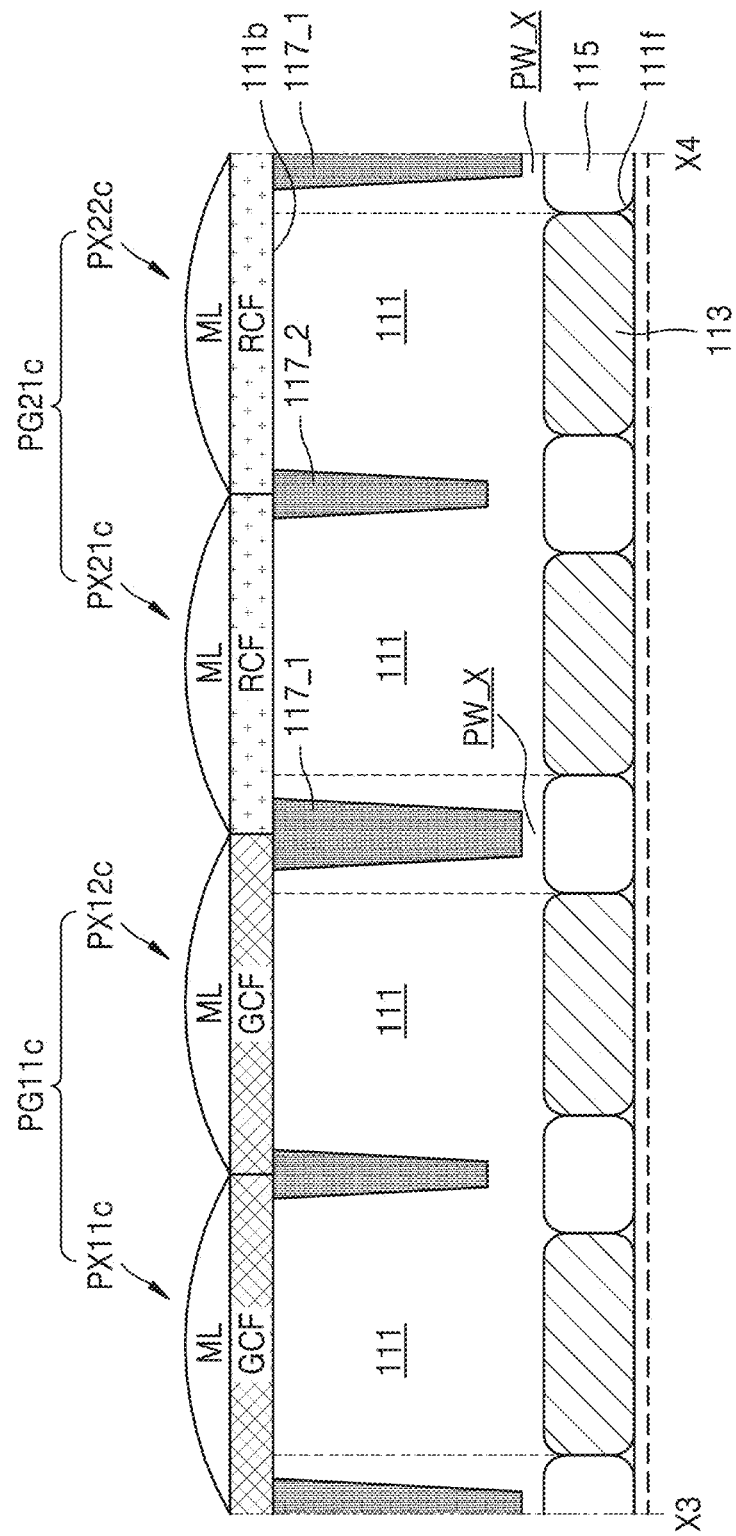
FIG. 9A is a cross-sectional view taken along line X3-X4 of FIG. 8
Figure 9B:
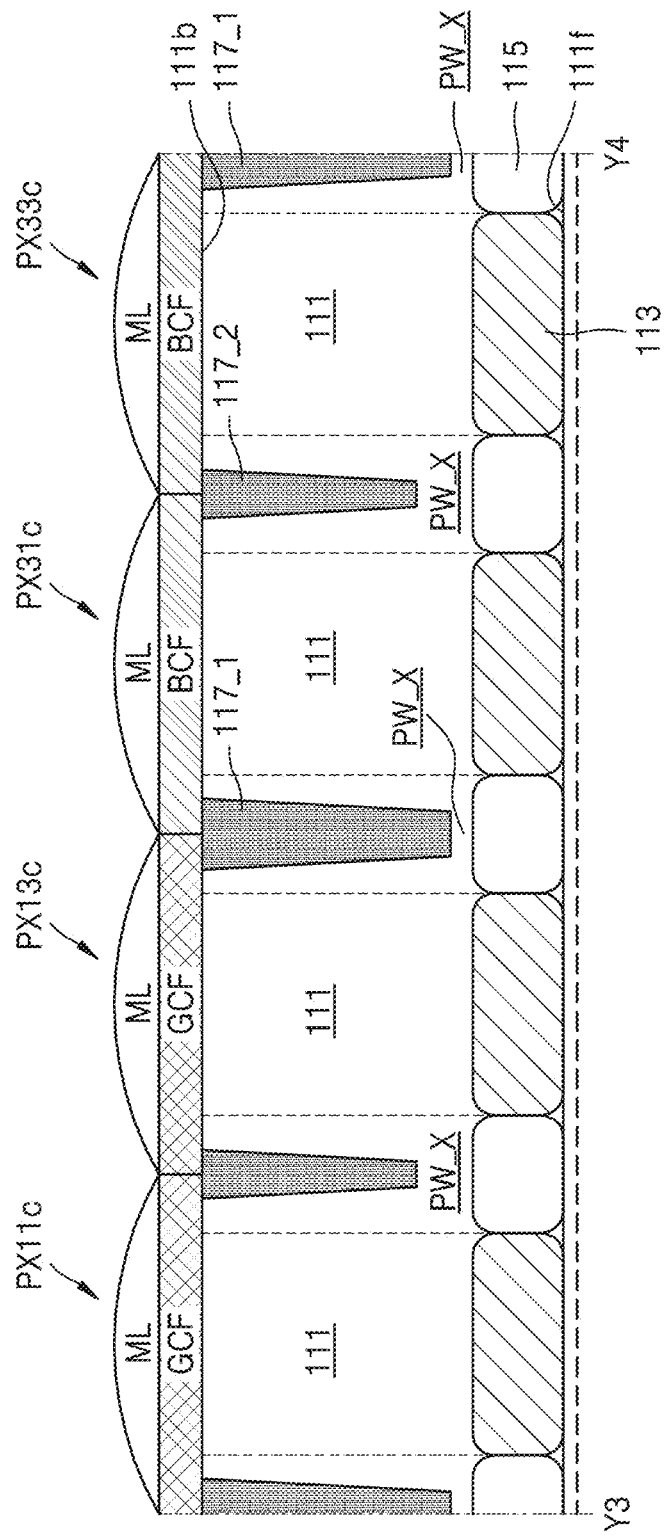
FIG. 9B is a cross-sectional view taken along line Y3-Y4 of FIG. 8.

FIG. 8 is a schematic diagram of a pixel array of an image sensor according to an embodiment of inventive concepts, and illustrates a third pixel array 110c included in the pixel array 110 of FIG. 2. FIGS. 9A and 9B illustrate a pixel array of an image sensor according to an embodiment of inventive concepts, wherein FIG. 9A is a cross-sectional view taken along line X3-X4 of FIG. 8 and FIG. 9B is a cross-sectional view taken along line Y3-Y4 of FIG. 8. The same reference characters and numerals in FIGS. 9A and 9B as those in FIGS. 5A and 5B denote the same elements, and thus their description will be omitted herein.

Referring to FIGS. 8, 9A, and 9B, the third pixel array 110c may include first through fourth shared pixel regions SP1c through SP4c. Each of the first through fourth shared pixel regions SP1c through SP4c may include sub-pixel regions in which the same color filter is arranged.

According to an embodiment, in the first through fourth shared pixel regions SP1c through SP4c, first pixel group regions PG11c, PG21c, PG31c, and PG41c and second pixel group regions PG12c, PG22c, PG32c, and PG42c may be formed, respectively. For convenience of explanation, only the first shared pixel region SP1c will now be described.

However, the description of the first shared pixel region SP1c may be equally applied to the second through fourth shared pixel regions SP2c through SP4c.

The first shared pixel region SP1c may include the first pixel group region PG11c including a first sub-pixel region PX11c and a second sub-pixel region PX12c arranged in a first row, and the second pixel group region PG12c including a third sub-pixel region PX13c and a fourth sub-pixel region PX14c arranged in a second row. The first pixel group region PG11c and the second pixel group region PG12c of the first shared pixel region SP1c may be arranged side by side in the second direction Y, which is a column direction. Accordingly, a processor (for example, the processor 1200 of FIG. 1) may perform an AF operation of the second direction Y, based on a first pixel signal (for example, the first pixel signal Vout1 of FIG. 3) output by the first pixel group region PG11c and a second pixel signal (for example, the second pixel signal Vout2 of FIG. 3) output by the second pixel group region PG12c.

Second well regions PW_X having a second conductivity type (for example, a p type) may be formed on separation impurity layers 115. The second well regions PW_X may be formed by ion-implanting impurities of the second conductivity type into the semiconductor substrate 111. A doping concentration of the second well regions PW_X may be lower than that of the separation impurity layers 115.

A second well region PW_X may be formed to surround the first pixel group region PG11c and the second pixel group region PG12c. In other words, the second well region PW_X may be formed on a boundary region that surrounds center regions of the first pixel group region PG11c and the second pixel group region PG12c, and may be spaced apart from the center regions of the first pixel group region PG11c and the second pixel group region PG12c. In other words, the second well region PW_X may not be formed on the center regions of the first pixel group region PG11c and the second pixel group region PG12c.

Although not shown in FIGS. 9A, and 9B, according to an embodiment, a first well region (for example, the first well region NW_X of FIG. 5A) having the first conductivity type (for example, n-type impurities) may be formed on the photo-sensing regions 113. The first well region may be formed over the sub-pixel regions included in the same pixel group region. For example, a single first well region may be formed over the first sub-pixel region PX11c and the second sub-pixel region PX12 included in the first pixel group region PG11c of the first shared pixel region SP1c. Alternatively, N-type well region may be formed in each of subpixel regions included in the same pixel group region.

In contrast with the FIGS. 8, 9A, and 9B, the first shared pixel region SP1c may include a first pixel group region including the first sub-pixel region PX11c and the third sub-pixel region PX13c arranged in a first column, and a second pixel group region including the second sub-pixel region PX12c and the fourth sub-pixel region PX14c arranged in a second column. In this case, the first pixel group region and the second pixel group region of the first shared pixel region SP1c may be arranged side by side in the first direction X, which is a row direction. In this case, the processor 1200 of FIG. 1 may perform an AF operation of the first direction X, based on a first pixel signal (for example, the first pixel signal Vout1 of FIG. 3) output by the first pixel group region and a second pixel signal (for example, the second pixel signal Vout2 of FIG. 3) output by the second pixel group region.

Figure 10:
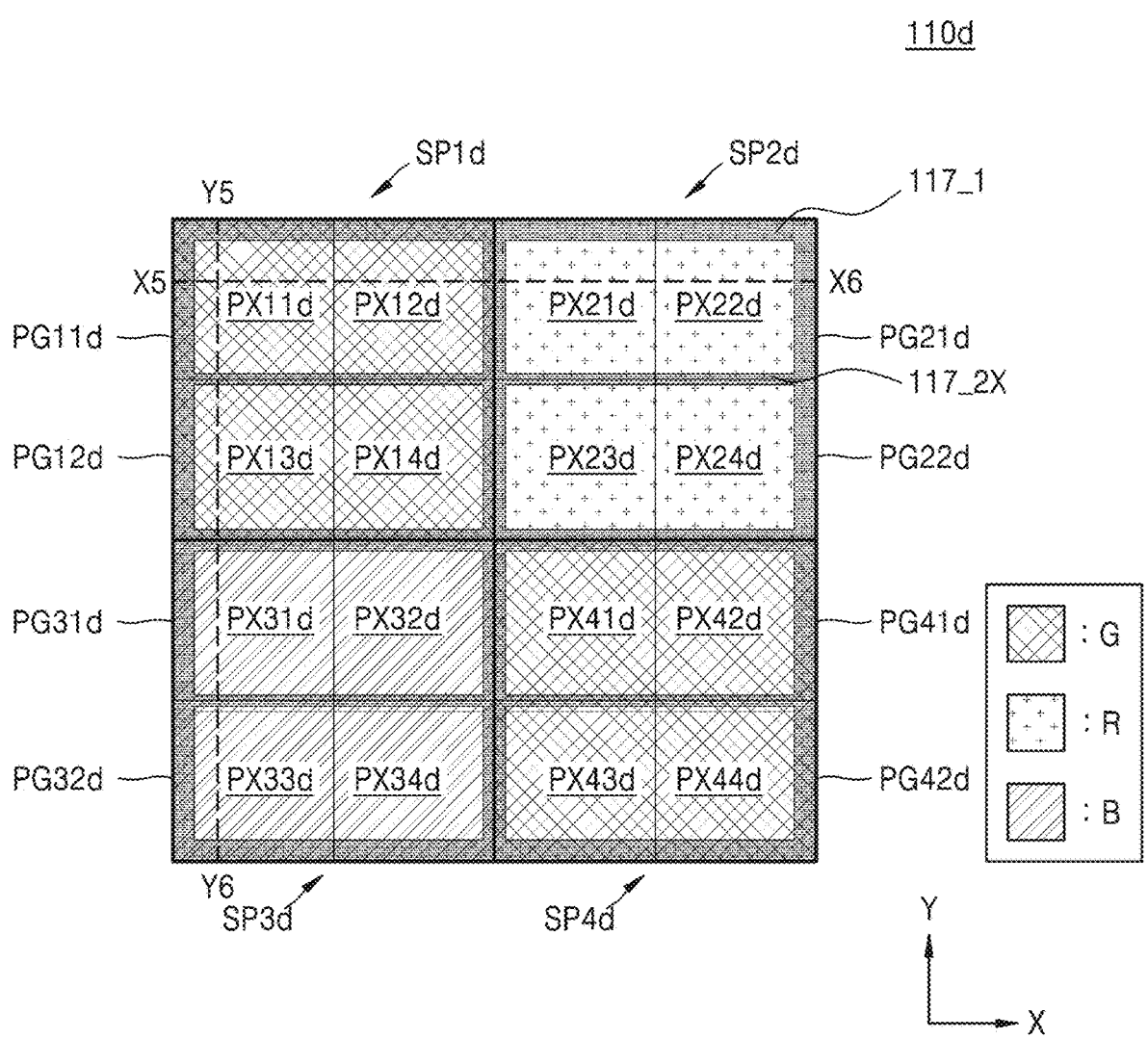
FIG. 10 illustrates a pixel array of an image sensor according to an embodiment of inventive concepts.
Figure 11A:
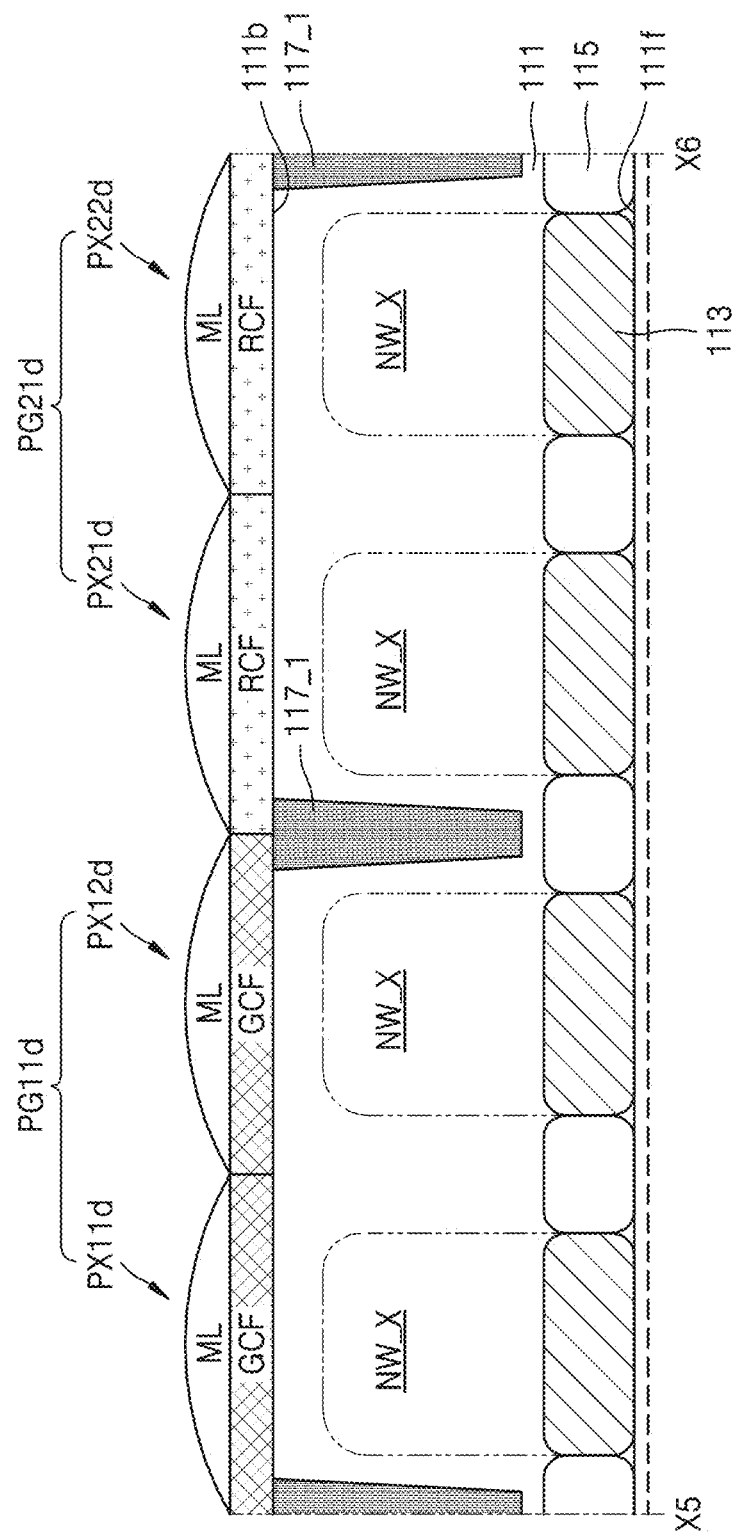
FIG. 11A is a cross-sectional view taken along line X5-X6 of FIG. 10
Figure 11B:
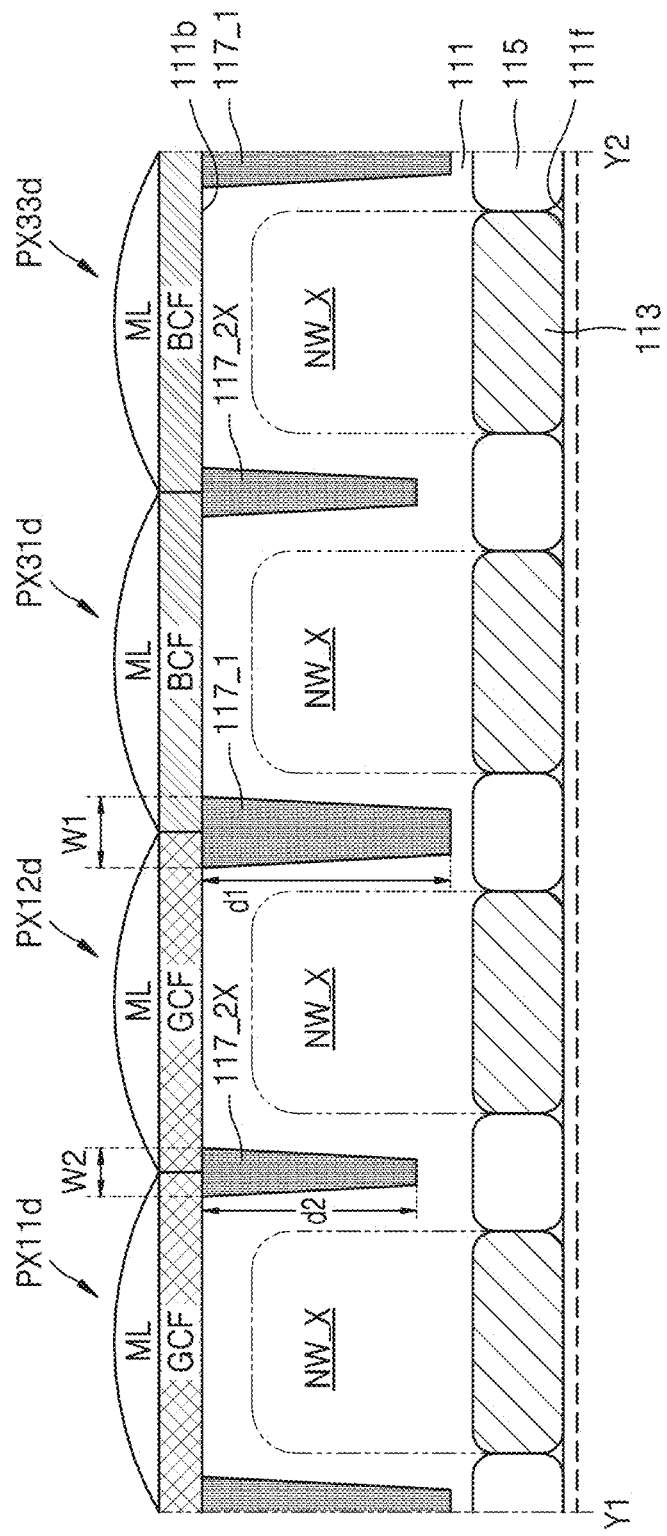
FIG. 11B is a cross-sectional view taken along line Y5-Y6 of FIG. 10.

FIG. 10 is a schematic diagram of a pixel array of an image sensor according to an embodiment of inventive concepts, and illustrates a fourth pixel array 110d included in the pixel array 110 of FIG. 2. FIGS. 11A and 11B illustrate a pixel array of an image sensor according to an embodiment of inventive concepts, wherein FIG. 11A is a cross-sectional view taken along line X5-X6 of FIG. 10 and FIG. 11B is a cross-sectional view taken along line Y5-Y6 of FIG. 10. The same reference characters and numerals in FIGS. 11A and 11B as those in FIGS. 5A and 5B denote the same elements, and thus their description will be omitted herein.

Referring to FIGS. 10, 11A, and 11B, the fourth pixel array 110d may include first through fourth shared pixel regions SP1d through SP4d. Each of the first through fourth shared pixel regions SP1d through SP4d may include sub-pixel regions in which the same color filter is arranged.

According to an embodiment, in the first through fourth shared pixel regions SP1d through SP4d, first pixel group regions PG11d, PG21d, PG31d, and PG41d and second pixel group regions PG12d, PG22d, PG32d, and PG42d may be formed, respectively. For convenience of explanation, only the first shared pixel region SP1d will now be described. However, the description of the first shared pixel region SP1d may be equally applied to the second through fourth shared pixel regions SP2d through SP4d.

The first shared pixel region SP1d may include the first pixel group region PG11d including a first sub-pixel region PX11d and a second sub-pixel region PX12d arranged in a first row, and the second pixel group region PG12d including a third sub-pixel region PX13d and a fourth sub-pixel region PX14d arranged in a second row. The first pixel group region PG11d and the second pixel group region PG12d of the first shared pixel region SP1d may be arranged side by side in the second direction Y, which is a column direction.

A first isolation layer 117_1 and a second isolation layer 117_2X may be formed within the semiconductor substrate 111. The first isolation layers 117_1 may be formed to surround the first shared pixel region SP1d. In other words, the first isolation layer 117_1 may define a single shared pixel region.

The second isolation layer 117_2X may be formed within the first through fourth shared pixel regions SP1d through SP4d. According to an embodiment, the second isolation layer 117_2X extending in the first direction X may be formed between the first pixel group region PG11d and the second pixel group region PG12d. The second isolation layer 117_2X may not be formed inside the first pixel group region PG11c and inside the second pixel group region PG12c, for example, on center regions of the first pixel group region PG11c and the second pixel group region PG12c. In other words, at least two sub-pixel regions (for example, the first sub-pixel region PX11d and the second sub-pixel region PX12d) may be arranged within a closed curved surface formed by the first isolation layer 117_1 and the second isolation layer 117_2X.

Because the fourth pixel array 110d does not include the second isolation layer 117_2X inside a pixel group region, namely, a center region of the pixel group region, light scattering due to the second isolation layer 117_2X may be limited and/or prevented. In addition, a light-receiving region of the sub-pixel regions (for example, the first and second sub-pixel regions PX11d and PX12d) included in a single pixel group region (for example, the first pixel group region PG11d) may increase.

According to an embodiment, the first isolation layer 117_1 may be formed to have a greater width than the second isolation layer 117_2X. In other words, a first width w1 of the first isolation layer 117_1 may be greater than a second width w2 of the second isolation layer 117_2X.

According to an embodiment, the first isolation layer 117_1 may be formed more deeply than the second isolation layer 117_2X. In other words, a first depth d1 of the first isolation layer 117_1 from one surface (for example, the second surface 111b) of the semiconductor substrate 111 may be greater than a second depth d2 of the second isolation layer 117_2X from the surface (for example, the second surface 111b) of the semiconductor substrate 111. Because the first width w1 of the first isolation layer 117_1 formed between shared pixel regions is relatively large and the first depth d1 of the first isolation layer 117_1 is relatively large, occurrence of cross-talk between the shared pixel regions may be limited and/or prevented.

According to an embodiment, a first well region (for example, the first well region NW_X of FIG. 5A) having the first conductivity type may be formed on the photo-sensing regions 113. The first well region may be formed over the sub-pixel regions included in the same pixel group region. For example, a single first well region NW_X may be formed over the first sub-pixel region PX11d and the second sub-pixel region PX12d included in the first pixel group region PG11d of the first shared pixel region SP1d. A second well region (for example, the second well region PW_X of FIG. 9B) having the second conductivity type may be further formed on the separation impurity layer 115. The second well region PW_X may be formed to surround each of the first pixel group region PG11d and the second pixel group region PG12d.

According to an embodiment, a processor (for example, the processor 1200 of FIG. 1) may receive first pixel information corresponding to a first pixel signal Vout1 output by each of the first pixel group regions PG11d, PG21d, PG31d, and PG41d of the first through fourth shared pixel regions SP1d through SP4d, and may receive second pixel information corresponding to a second pixel signal Vout2 output by each of the second pixel group regions PG12d, PG22d, PG32d, and PG42d of the first through fourth shared pixel regions SP1d through SP4d. The processor 1200 may perform an AF operation of the second direction Y, which is a column direction, or a distance measuring operation of the second direction Y, by using the first pixel information and the second pixel information.

Figure 12:
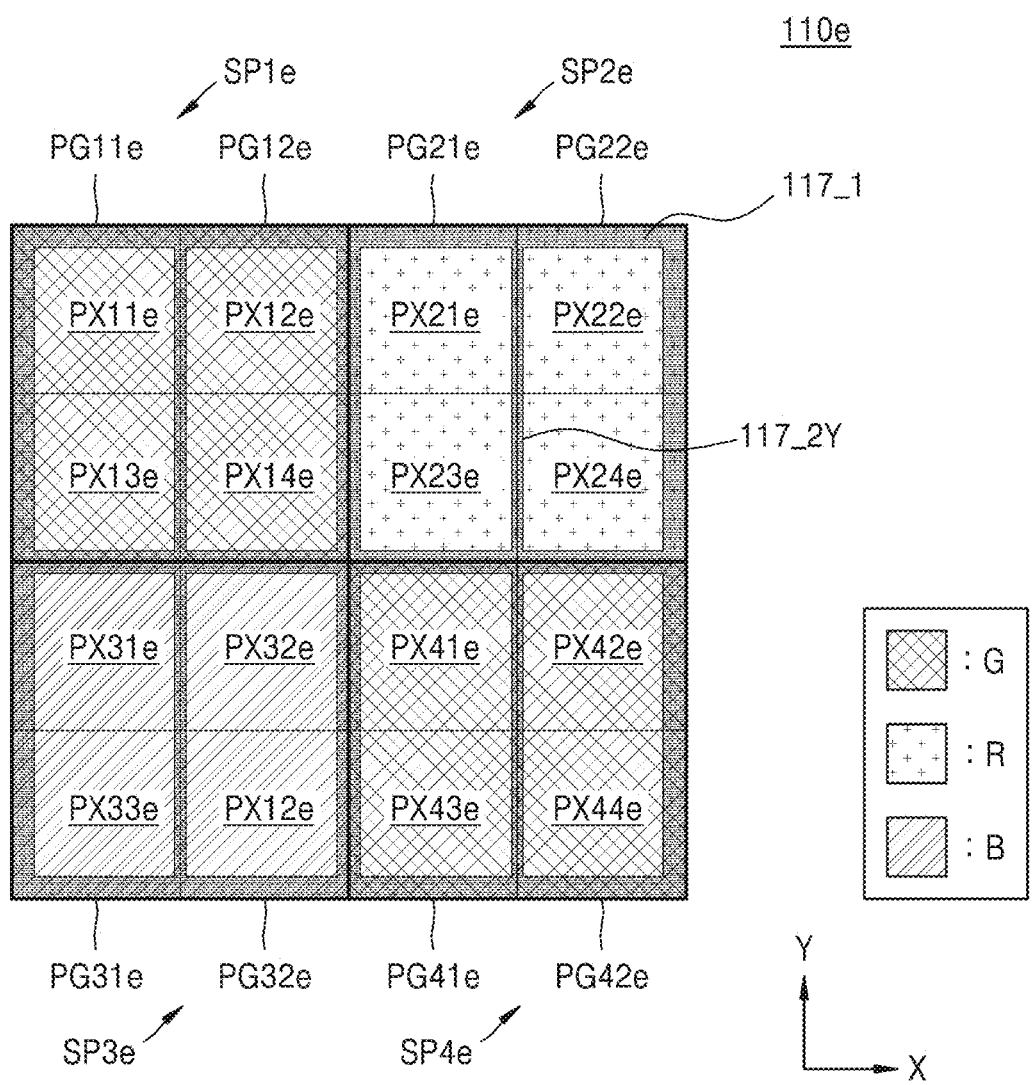
FIG. 12 illustrates a pixel array of an image sensor according to an embodiment of inventive concepts.

FIG. 12 is a schematic diagram of a pixel array of an image sensor according to an embodiment of inventive concepts, and illustrates a fifth pixel array 110e included in the pixel array 110 of FIG. 2.

Referring to FIG. 12, the fifth pixel array 110e may include first through fourth shared pixel regions SP1e through SP4e. Each of the first through fourth shared pixel regions SP1e through SP4e may include sub-pixel regions in which the same color filter is arranged.

According to an embodiment, in the first through fourth shared pixel regions SP1e through SP4e, first pixel group regions PG11e, PG21e, PG31e, and PG41e and second pixel group regions PG12e, PG22e, PG32e, and PG42e may be formed, respectively. For convenience of explanation, only the first shared pixel region SP1e will now be described. However, the description of the first shared pixel region SP1e may be equally applied to the second through fourth shared pixel regions SP2e through SP4e.

The first shared pixel region SP1e may include the first pixel group region PG11e including a first sub-pixel region PX11e and a third sub-pixel region PX13e arranged in a first column, and the second pixel group region PG12e including a second sub-pixel region PX12e and a fourth sub-pixel region PX14e arranged in a second column. The first pixel group region PG11e and the second pixel group region PG12e of the first shared pixel region SP1e may be arranged side by side in the first direction X, which is a row direction.

A first isolation layer 117_1 and a second isolation layer 117_2Y may be formed within the fifth pixel array 110e. The second isolation layer 117_2Y may be formed within the first through fourth shared pixel regions SP1e through SP4e. According to an embodiment, the second isolation layer 117_2Y extending in the second direction Y may be formed between the first pixel group region PG11e and the second pixel group region PG12e. The second isolation layer 117_2Y may not be formed on a center region of the first pixel group region PG11e and a center region of the second pixel group region PG12e. In other words, at least two sub-pixel regions (for example, the first sub-pixel region PX11e and the second sub-pixel region PX12e) may be arranged within a closed curved surface formed by the first isolation layer 117_1 and the second isolation layer 117_2Y.

According to an embodiment, the first isolation layer 117_1 may be formed to have a greater width than the second isolation layer 117_2Y. According to an embodiment, the first isolation layer 117_1 may be formed more deeply than the second isolation layer 117_2Y.

According to an embodiment, a processor (for example, the processor 1200 of FIG. 1) may receive first pixel information corresponding to a first pixel signal Vout1 output by each of the first pixel group regions PG11e, PG21e, PG31e, and PG41e of the first through fourth shared pixel regions SP1e through SP4e, and may receive second pixel information corresponding to a second pixel signal Vout2 output by each of the second pixel group regions PG12e, PG22e, PG32e, and PG42e of the first through fourth shared pixel regions SP1e through SP4e. The processor 1200 may perform an AF operation of the first direction X, which is a row direction, or a distance measuring operation of the first direction X, by using the first pixel information and the second pixel information.

According to an embodiment, a pixel array (for example, the pixel array 110 of FIG. 2) of an image sensor may include both the fourth pixel array 110d of FIG. 10 and the fifth pixel array 110e of FIG. 12. Accordingly, the image sensor may perform respective AF functions of the first direction X and the second direction Y. According to an embodiment, the pixel array 110 of the image sensor may include the fourth pixel array 110d and the fifth pixel array 110e arranged adjacent to each other.

While inventive concepts have been particularly shown and described with reference to embodiments thereof, it will be understood that various changes in form and details may be made therein without departing from the spirit and scope of the following claims.

What is claimed is:
1. An image sensor comprising:
a substrate having a first surface and a second surface; and
a plurality of shared pixel regions formed in the substrate,
the plurality of shared pixel regions arranged in a first direction and a second direction perpendicular to the first direction;
wherein each of the plurality of shared pixel regions includes a first pixel group region and a second pixel group region arranged in the second direction,
wherein each of the first pixel group region and the second pixel group region includes a first sub-pixel region and a second sub-pixel region arranged in the first direction,
wherein each of the first sub-pixel region and the second sub-pixel region includes a photo sensing region on the first surface of the substrate, wherein each of the first pixel group region and the second pixel group region includes a first well region doped with first conductivity type impurities and formed on the photo sensing region in a third direction perpendicular to the first direction and the second direction, and wherein different first well regions in each of the plurality of shared pixel regions are separated from each other.

2. The image sensor of claim 1, wherein
an impurity concentration of the first well region is lower than an impurity concentration of the photo sensing region.

3. The image sensor of claim 1, further comprising:
a first isolation layer extended from the second surface of the substrate, the first isolation layer defining each of the plurality of shared pixel regions; and
a second isolation layer extended from the second surface of the substrate, the second isolation layer disposed between the first pixel group region and the second pixel group region.

4. The image sensor of claim 1, further comprising:
a first isolation layer extended from the second surface of the substrate, the first isolation layer defining each of the plurality of shared pixel regions; and
a second isolation layer extended from the second surface of the substrate, the second isolation layer disposed between the first sub-pixel region and the second sub-pixel region.

5. The image sensor of claim 1, wherein
charges generated in each of the first sub-pixel region and the second sub-pixel region included in a same pixel group region among the first pixel group region and the second pixel group region are movable to each other.

6. The image sensor of claim 1, further comprising:
a second well region doped with second conductivity type impurities and disposed between each of the plurality of shared pixel regions.

7. The image sensor of claim 6, further comprising:
a first isolation layer extended from the second surface of the substrate, the first isolation layer defining each of the plurality of shared pixel regions; and
wherein the second well region surrounds the first isolation layer in the third direction.

8. The image sensor of claim 1, further comprising:
a plurality of color filters on the second surface of the substrate,
wherein a corresponding color filter among the plurality of color filters is disposed on each of the plurality of shared pixel regions.

9. The image sensor of claim 1, further comprising:
a plurality of microlens on the second surface of the substrate,
wherein a corresponding microlens among the plurality of microlens is disposed on each of the plurality of shared pixel regions.

10. The image sensor of claim 9, wherein
the image sensor performs an AF function using a first pixel signal and a second pixel signal,
the first pixel signal is a signal according to charges generated in the first sub-pixel region and the second sub-pixel region included in the first pixel group region, and
the second pixel signal is a signal according to charges generated in the first sub-pixel region and the second sub-pixel region included in the second pixel group region.

11. The image sensor of claim 1, further comprising:
separation impurity layers on the first surface of the substrate and surrounding the photo sensing region of the first sub-pixel region and the photo sensing region of the second sub-pixel region.

* * * * *